(12) United States Patent
Mishima et al.

(10) Patent No.: US 6,746,589 B2
(45) Date of Patent: Jun. 8, 2004

(54) PLATING METHOD AND PLATING APPARATUS

(75) Inventors: Koji Mishima, Fujisawa (JP); Hiroaki Inoue, Tokyo (JP); Natsuki Makino, Fujisawa (JP); Junji Kunisawa, Yamato (JP); Kenji Nakamura, Fujisawa (JP); Tetsuo Matsuda, Yokohama (JP); Hisashi Kaneko, Fujisawa (JP); Toshiyuki Morita, Yokohama (JP)

(73) Assignees: Ebara Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 81 days.

(21) Appl. No.: 09/955,115

(22) Filed: Sep. 19, 2001

(65) Prior Publication Data

US 2002/0056647 A1 May 16, 2002

(30) Foreign Application Priority Data

Sep. 20, 2000 (JP) .......................... 2000-285740
Sep. 27, 2000 (JP) .......................... 2000-294665
Aug. 17, 2001 (JP) .......................... 2001-248125

(51) Int. Cl.$^7$ ............................................. C25D 5/00
(52) U.S. Cl. .................... 205/98; 205/101; 205/123; 205/148; 205/170; 205/182
(58) Field of Search ............................. 205/81, 82, 98, 205/101, 123, 148, 170, 182

(56) References Cited

U.S. PATENT DOCUMENTS 6,379,520 B1 * 4/2002 Kuriyama et al. ............ 205/81
6,508,924 B1 * 1/2003 Gomet et al. ................ 205/81

FOREIGN PATENT DOCUMENTS

JP          4-154122          5/1992

* cited by examiner

Primary Examiner—Roy King
Assistant Examiner—William T. Leader
(74) Attorney, Agent, or Firm—Wenderoth, Lind & Ponack, L.L.P.

(57) ABSTRACT

The present invention relates to a plating method and a plating apparatus which can attain embedding of copper into fine interconnection patterns with use of a plating liquid having high throwing power and leveling properties, and which can make film thickness of a plated film substantially equal between an interconnection region and a non-interconnection region. A plating method comprises filling a plating liquid containing metal ions and an additive into a plating space formed between a substrate and an anode disposed closely to the substrate so as to face the substrate, and changing concentration of the additive in the plating liquid filled into the plating space during a plating process.

16 Claims, 27 Drawing Sheets

F I G. 3
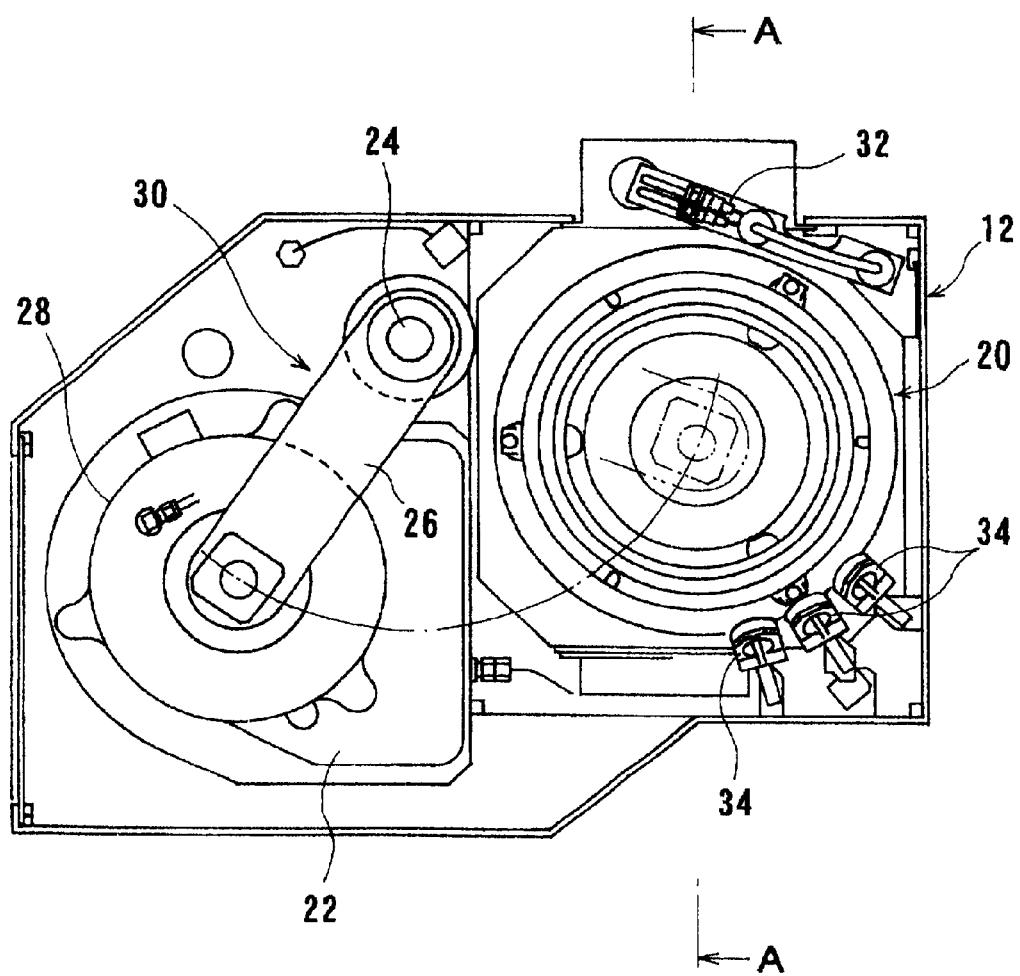

At the initiation of plating

At the completion of plating

F I G. 2 9
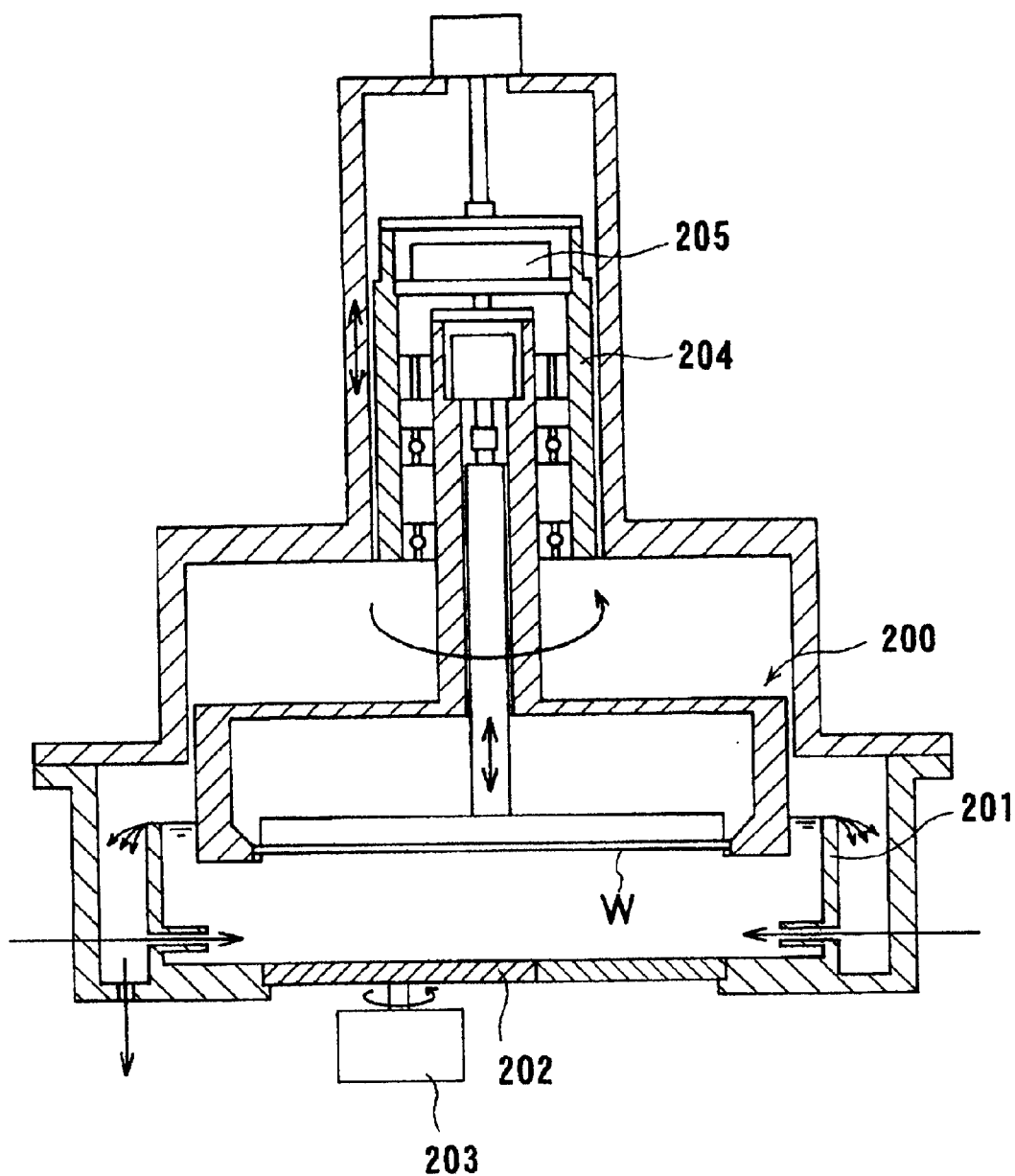

PLATING METHOD AND PLATING APPARATUS

BACKGROUND OF THE INVENTION

1. Field of the Invention

The present invention relates to a plating method and a plating apparatus, and more particularly to a plating method and a plating apparatus for filling a metal such as copper (Cu) or the like into fine interconnection patterns (trenches) on a semiconductor substrate.

2. Description of the Related Art

Aluminum or an aluminum alloy has generally been used as a material for forming interconnect circuits on semiconductor substrates. As integrated density has increased in recent years, there is a demand for usage of a material having a higher conductivity as an interconnect material. It has been proposed to plate a substrate having interconnect pattern trenches thereon to fill the trenches with copper or its alloy.

There are known various processes including CVD (chemical vapor deposition), sputtering, and the like to fill interconnect pattern trenches with copper or its alloy. However, the CVD process is costly for forming copper interconnections, and the sputtering process fails to embed copper or its alloy in interconnect pattern trenches when the interconnect pattern trenches have a high aspect ratio, i.e., a high ratio of depth to width. A plating process is most effective to deposit a metal layer of copper or its alloy on a substrate to form copper interconnections thereon.

Various processes are available for plating semiconductor substrates with copper. These include a process of immersing a substrate in a plating liquid held at all times in a plating tank, referred to as a cup-type or dipping-type process; a process of holding a plating liquid in a plating tank only when a substrate, to be plated, is supplied to the plating tank; an electric plating process for plating a substrate with a potential difference; and an electroless plating process for plating a substrate with no potential difference.

In carrying out filling of fine interconnect patterns with copper by electric copper-plating using a copper sulfate solution as a plating liquid, it is required to perform a plating process with high throwing power and high leveling properties. With a view to meeting this requirement, it is generally known to add to the plating liquid a compound called an additive.

Such an additive, generally in use, includes:

sulfur compounds called "carrier", which grow crystal nuclei all over a plated surface, thereby promoting deposition of finer particles;

polymers which increase over-voltage of copper deposition, thereby enhancing throwing power; and nitrogen compounds called "leveler", which adhere to convex portions, where plating preferentially grows, to thereby increase over-voltage and retard copper deposition at the convex portions, thereby providing a flat plated layer.

However, when filling fine interconnect patterns with copper by electric copper-plating is conducted by using a plating liquid which, due to use of the above additives, has enhanced throwing power and leveling properties, there occurs a phenomena that a film thickness of an interconnection region of a substrate becomes thicker than a film thickness of a non-interconnection region. Unevenness in film thickness is not a problem in filling the interconnection region with copper; however, unevenness makes it difficult to obtain a flat surface by performing later CMP (chemical mechanical polishing) processing.

A plating treatment of a substrate for filling interconnect pattern trenches with a metal, such as copper or its alloy, may be carried out by using a plating apparatus as shown in FIG. 30. As shown in FIG. 30, a substrate W and an anode 302 are disposed in parallel, facing each other, in a plating tank 301 accommodating a plating liquid 300. Plating is conducted by flowing a plating current i between the substrate W and the anode 302. A film thickness h of a plated film formed at a certain point on a surface of the substrate W is proportional to a product of a plating current value and energization time. The plating current value in FIG. 30 is defined by the following formula (1):

$$i=E/(R1+R2+R3+R4) \quad (1)$$

In the above formula (1), E represents power source voltage, R1 anodic polarization resistance, R2 resistance of the plating liquid 300, R3 substrate (cathodic) polarization resistance, and R4 sheet resistance of the substrate W at the certain point. The anodic polarization resistance R1 and the substrate polarization resistance R3 are interfacial resistances of the anode 302 and of the substrate W, respectively, and change with concentration of an additive or of the plating liquid. The resistance R2 of the plating liquid 300 is proportional to a distance between the anode 302 and the substrate (cathode) W.

An electric supply to the substrate W is made via a cathode electrode 303 which is generally connected to a peripheral end of the substrate W. Accordingly, the sheet resistance R4 at a point increases as a distance from the peripheral end of the substrate W increases, i.e., as the point comes near to center P of the substrate W. Therefore, the plating current value on an inner central side of the substrate W is smaller than that on an outer peripheral side (see the above formula (1)), whereby it is likely that film thickness becomes smaller on the inner central side as compared to the outer peripheral side. There has thus been a problem in conventional plating apparatuses that a plated film having a uniform film thickness over an entire substrate surface is difficult to form. Especially when an LSI interconnection is formed by plating, a small thickness, generally 50–200 nm, of a seed layer of the substrate (Si substrate) makes the sheet resistance R4 considerably larger. Such a large sheet resistance R4 has a larger influence on film thickness.

SUMMARY OF THE INVENTION

The present invention has been made in view of the above drawbacks in the related art. It is therefore a first object of the present invention to provide a plating method and a plating apparatus which can attain embedding of copper into fine interconnect patterns with use of a plating liquid having high throwing power and leveling properties, and which can make film thickness of a plated film substantially equal between an interconnection region and a non-interconnection region, thereby facilitating later CMP processing.

It is a second object of the present invention to provide a plating apparatus and a plating method which can form a plated film having a more uniform film thickness over an entire surface of a substrate.

In order to achieve the first object, the present invention provides a plating method, comprising: filling a plating liquid containing metal ions and an additive into a plating space formed between a substrate and an anode disposed closely to the substrate so as to face the substrate; and changing concentration of an additive in the plating liquid filled into the plating space during a plating process.

In the course of plating of a substrate, concentration of an additive in a plating liquid filled into a plating space formed between the substrate and an anode gradually decreases with duration of the plating due to take-in of the additive within deposited metal film and oxidation degradation at the anode. The change of additive concentration is larger in cases where ① plating of a substrate is by a close-to-anode plating where an amount of plating liquid itself is small, ② introduction of a plating liquid into the plating space is conducted only before plating, and not conducted during plating (batch-wise introduction), and ③ a plating liquid is introduced intermittently during plating. The concentration change of the plating liquid is larger when, during a plating process, an additional solution or a plating liquid containing a different concentration of additive is separately introduced into the plating space with a separate liquid introduction device.

By thus changing additive concentration of a plating liquid filled into a plating space during a plating process, unevenness in plated film thickness between an interconnection region and a non-interconnection region is reduced or corrected.

It is not fully clarified by what mechanism a difference in film thickness between the interconnection and non-interconnection regions is corrected by making a change in the additive concentration, during the plating process, of the plating liquid filled into the plating space. Anyway, in general, the difference in film thickness can be effectively corrected when concentration of an additive decreases during the plating process; when concentration of a particular additive, especially a plating-promoting additive called "brightener", is set at a high value; or when content of an additive is significantly lowered by, for example, adsorption removal of the additive. The film-thickness difference in question is considered to be produced at a middle or later stage of the plating process when filling metal into fine interconnect trenches has almost been completed. Accordingly, making a change in additive concentration of a plating liquid at a middle or later stage of plating is more effective than that at an initial stage when filling metal into interconnect trenches is in progress.

Concentration of an additive in a plating liquid can be adjusted by intermittently supplying the plating liquid into a plating space.

Additive concentration can also be adjusted by supplementary addition of the additive to a plating space, or by removal of the additive in a plating liquid.

The present invention also provides a plating apparatus, comprising: a substrate holder for holding a substrate so that a current can flow from a cathode to the substrate; an anode opposed to the substrate held by the substrate holder; and a plating liquid introducing device for introducing a plating liquid into a plating space formed between the substrate and the anode during a batch process or an intermittent process.

This apparatus can perform a plating treatment while changing concentration of an additive in a plating liquid filled into the plating space.

A plating liquid impregnation material may be provided in the plating space. The plating liquid impregnation material, e.g. synthetic fibers can adsorb and remove a particular additive component, e.g. a leveler, and thus is effective for reducing leveler concentration of a plating liquid.

Further, the plating apparatus may be provided with a liquid introducing device for introducing into the plating space a liquid having a different additive concentration from that in the above plating liquid. The addition of the liquid (solution or plating liquid) having the different additive concentration makes it possible to arbitrarily control, during a plating process, change of additive concentration in plating liquid filled into the plating space formed between the substrate and the anode. For example, addition of a liquid having a higher leveler concentration, during a plating process, can correct a film-thickness difference.

The plating apparatus may also be provided with a temperature adjusting device for adjusting a temperature of plating liquid in the plating space. Since adsorption reaction, which occurs on the above plating liquid impregnation material is highly temperature-dependent, use of a higher plating liquid temperature generally increases adsorption capacity of the plating liquid impregnation material.

In order to achieve the second object, the present invention provides a plating apparatus, comprising: a substrate holder for holding a substrate so that a current can flow from a cathode to the substrate; an anode opposed to the substrate held by the substrate holder; and a moving device for moving a portion of the substrate facing the anode in such a state that an inner central portion of a surface of the substrate faces the anode for a longer time than does an outer peripheral portion of the surface of the substrate.

This plating apparatus can make energization time of a plating current to the inner central portion of the surface of the substrate longer than energization time of the plating current to the outer peripheral portion of the surface of the substrate, thereby making products of electric current values and energization times of the electric current, at various points of the substrate, equal over an entire surface of the substrate. This enables formation of a plated film having a uniform film thickness over the entire surface of the substrate.

The moving device may comprise a substrate-rotating device for rotating the substrate, an anode-rotating device for rotating the anode, or an anode-translating device for translating the anode.

The present invention also provides another plating apparatus comprising: a substrate holder for holding a substrate so that a current can flow from a cathode to the substrate; and an anode opposed to the substrate held by the substrate holder, wherein a distance between the anode and an inner central portion of a surface of the substrate is smaller than a distance between the anode and an outer peripheral portion of the surface of the substrate.

This apparatus can make resistance of a plating liquid at the inner central portion of the substrate smaller than that at the outer peripheral portion of the surface of the substrate, thereby making an electric current value more equal at the inner central portion of the surface of the substrate to that at the outer peripheral portion of the surface of the substrate, whereby film thickness of plated film formed on the substrate can be made uniform over an entire surface of the substrate.

The present invention further provides a yet another plating apparatus comprising: a substrate holder for holding a substrate so that a current can flow from a cathode to the substrate; an anode opposed to the substrate held by the substrate holder; and a distance changing device for changing a distance between the substrate and the anode after initiation of plating.

At initiation of plating, a potential gradient on an inner central side of a surface of the substrate is higher than a potential gradient on an outer peripheral side of the surface of the substrate, whereby a larger amount of plated film is formed on the inner central side of the surface of the substrate. This situation can be reversed according to this apparatus, by later making a distance between the substrate and the anode larger. As a result, a plated film having a uniform film thickness over an entire surface of the substrate can be obtained.

The present invention also provides a plating method, comprising: disposing a substrate and an anode in such a state that the substrate faces the anode; flowing a current between the substrate and the anode while supplying a plating liquid therebetween; and moving a portion of the substrate facing the anode in such a state that an inner central portion of a surface of the substrate faces the anode for a longer time than does an outer peripheral portion of the surface of the substrate.

The present invention also provides another plating method, comprising: disposing a substrate and an anode in a state that the substrate faces the substrate; and flowing a current between the substrate and the anode while supplying a plating liquid therebetween, wherein a distance between the anode and an inner central portion of a surface of the substrate is smaller than a distance between the anode and an outer peripheral portion of the surface of the substrate.

The present invention further provides yet another plating method, comprising: disposing a substrate and an anode in a state that the substrate faces the anode; flowing a current between the substrate and the anode while supplying a plating liquid therebetween; and changing a distance between the substrate and the anode after initiation of plating.

BRIEF DESCRIPTION OF THE DRAWINGS

FIG. 3 is a plan view showing a plating unit;

FIG. 29 is a sectional view of a face-down type plating apparatus according to a seventh embodiment of the present invention.

DETAILED DESCRIPTION OF THE PREFERRED EMBODIMENTS

An embodiment of the present invention will be described below with reference to the drawings. A substrate plating apparatus according to this embodiment is used to apply copper electroplating onto a surface of a semiconductor substrate, thereby obtaining a semiconductor apparatus having interconnects comprising a copper layer formed thereon. A plating process will be explained with reference to FIGS. 1A through 1C.

Figure 1A:
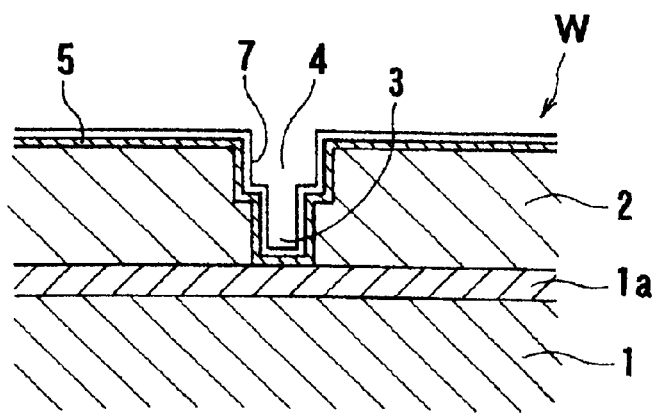
FIGS. 1A to 1C are sectional views showing an example of a process for performing plating by a plating apparatus and a plating method of the present invention.

As shown in FIG 1A, an oxide film 2 of $SiO_2$ is deposited on a conductive layer 1*a* on a semiconductor substrate 1 on which semiconductor devices are formed. A contact hole 3 and a trench 4 for an interconnect are formed by performing lithography and etching technology. A barrier layer 5 of TIN or the like is formed on the oxide film 2, and then a seed layer 7, as an electric supply layer for electroplating, is formed on the barrier layer 5.

Figure 1B:
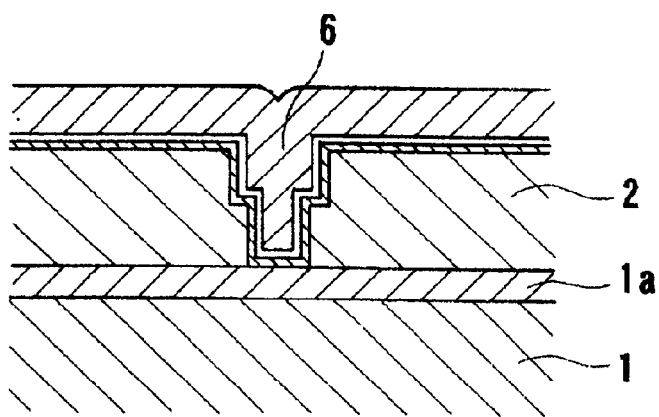
Figure 1C:
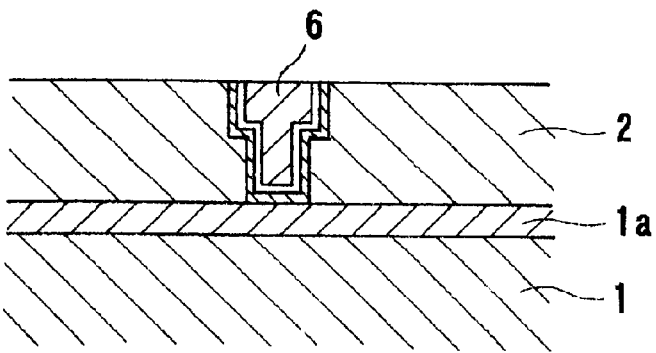

Then, as shown in FIG. 1B, a surface of the seed layer 7 is coated with copper by performing copper electroplating to deposit a plated copper film 6 on the oxide film 2, thus filling the contact hole 3 and the trench 4 with copper. Thereafter, the plated copper film 6 on the oxide film 2 is removed by performing chemical mechanical polishing (CMP), thus causing the plated copper film 6 in the contact hole 3 and the trench 4 to lie flush with the oxide film 2. In this manner, an interconnect composed of copper 6 is formed as shown in FIG 1C.

Figure 2:
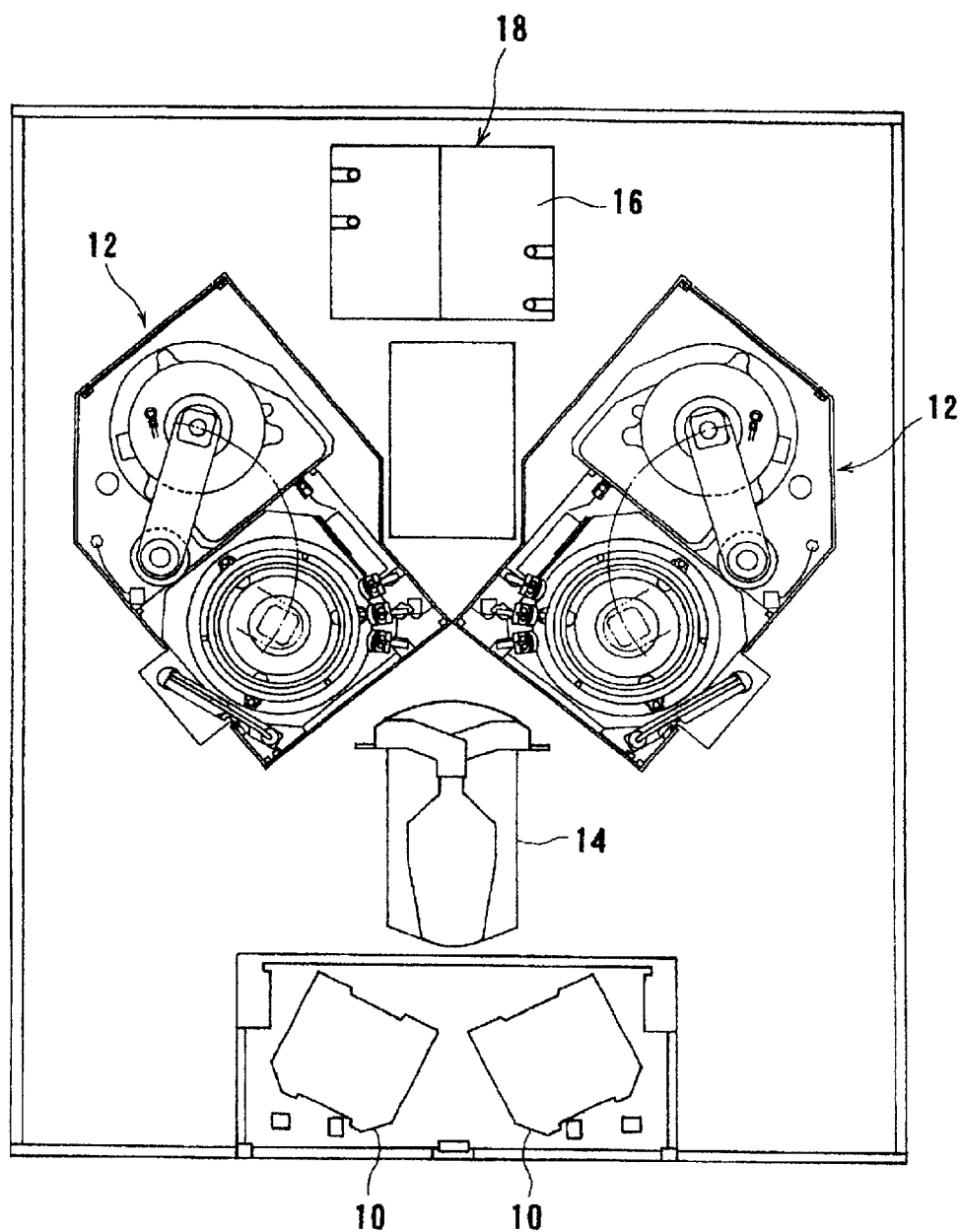
FIG. 2 is a plan view showing an entire plating apparatus according to a first embodiment of the present invention.

FIG. 2 is a plan view showing an entire plating apparatus for a substrate according to an embodiment of the present invention. As shown in FIG. 2, this plating apparatus has a rectangular facility which houses therein two loading/unloading units 10 for housing a plurality of substrates W therein, two plating units 12 for performing plating treatment and treatment incidental thereto, a transfer robot 14 for transferring substrates W between the loading/unloading units 10 and the plating units 12, and plating liquid supply equipment 18 having a plating liquid tank 16.

The plating liquid used in this embodiment contains the following additives: a sulfur-containing compound, such as thiourea and acrylic thiourea, as a carrier (brightener); polyether, polyethylene glycol or their derivatives as a polymer; and a nitrogen compound having a positive charge, such as polyamine or dyestuffs, as a leveler. Of course, the present invention is not limited to use of these additives.

Each plating unit 12, as shown in FIG. 3, is provided with a substrate treatment section 20 for performing plating treatment and treatment incidental thereto, and a plating liquid tray 22 for storing a plating liquid is disposed adjacent to the substrate treatment section 20. There is also provided an electrode arm 30 having an electrode portion 28 which is held at a front end of an arm 26 swingable about a rotating shaft 24, and which is swung between the substrate treatment section 20 and the plating liquid tray 22. Furthermore, a pre-coating/recovering arm 32, and fixed nozzles 34, for ejecting pure water or a chemical liquid such as ion water along with a gas or the like toward a substrate, are disposed laterally of the substrate treatment section 20. In this embodiment, three fixed nozzles 34 are disposed, and one of them is used for supplying pure water.

Figure 4:
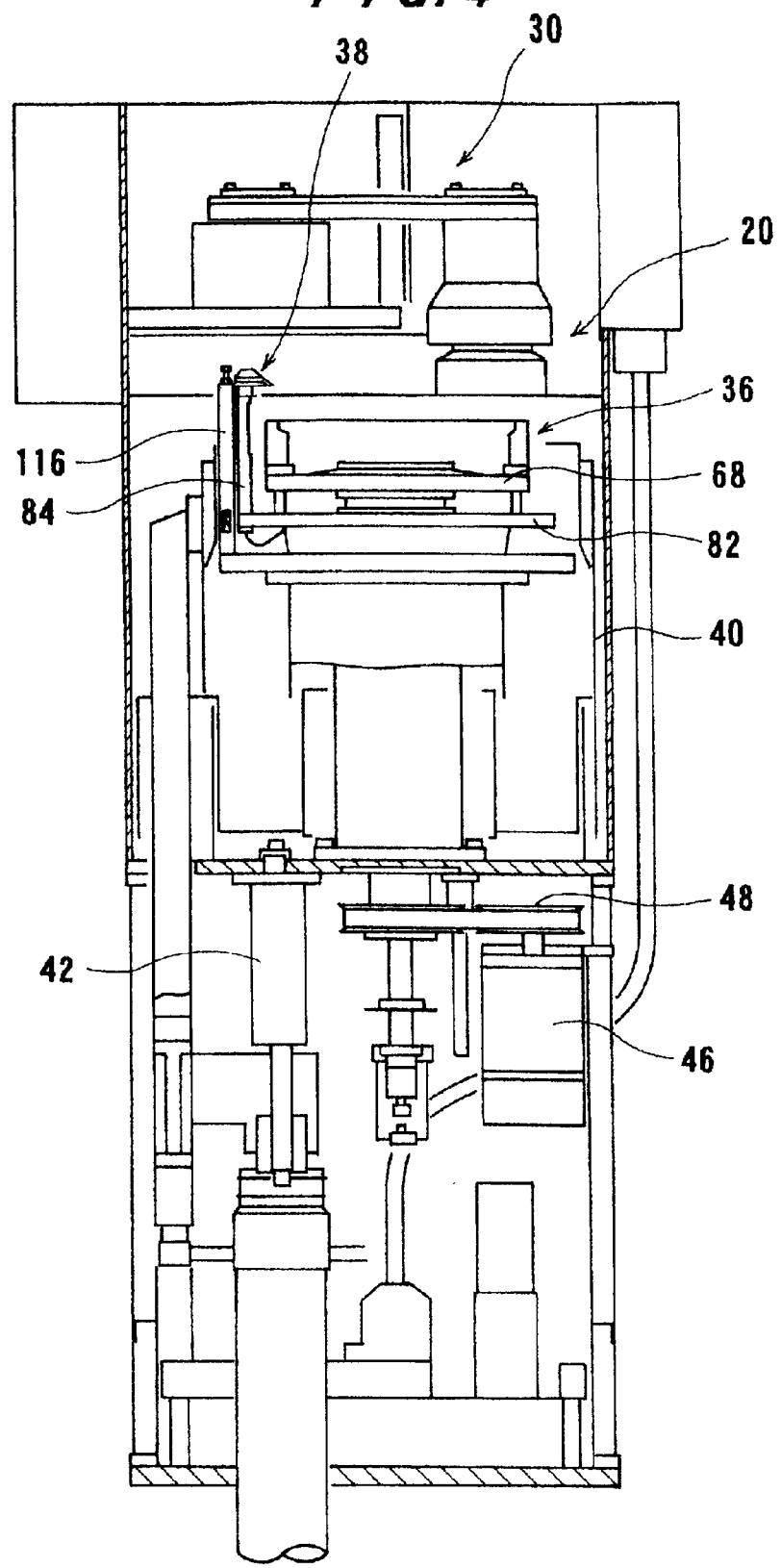
FIG. 4 is a sectional view taken along line A—A of FIG. 3.
Figure 5:
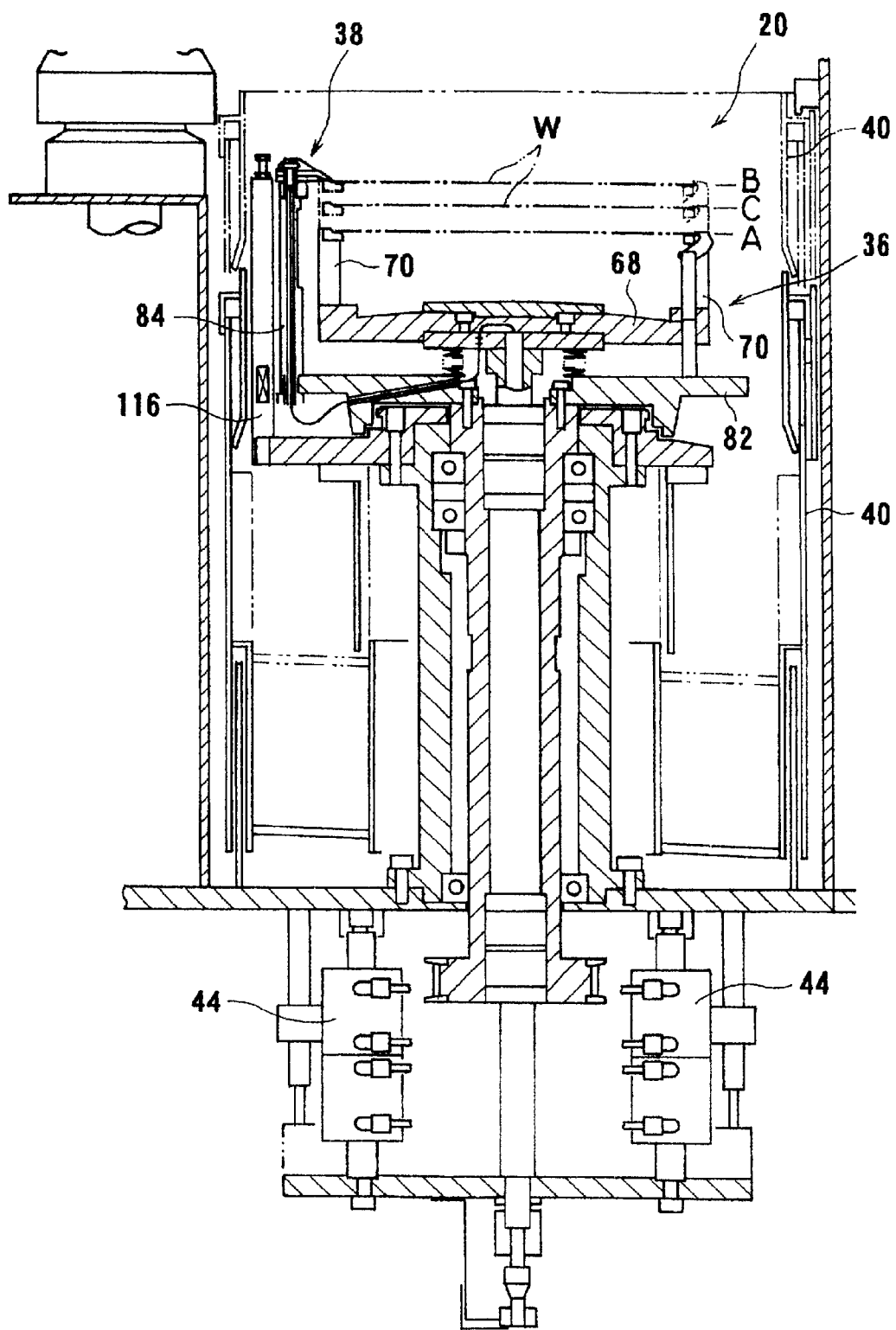
FIG. 5 is an enlarged sectional view of a substrate holder and a cathode portion.

The substrate treatment section 20, as shown in FIGS. 4 and 5, has a substrate holder 36 for holding a substrate W with its surface to be plated facing upwardly, and a cathode portion 38 located above the substrate holder 36 so as to surround a peripheral portion of the substrate holder 36. Further, a substantially cylindrical bottomed cup 40 surrounding a periphery of the substrate holder 36, for preventing scatter of various chemical liquids used during treatment, is provided so as to be vertically movable by an air cylinder 42.

Figure 7:
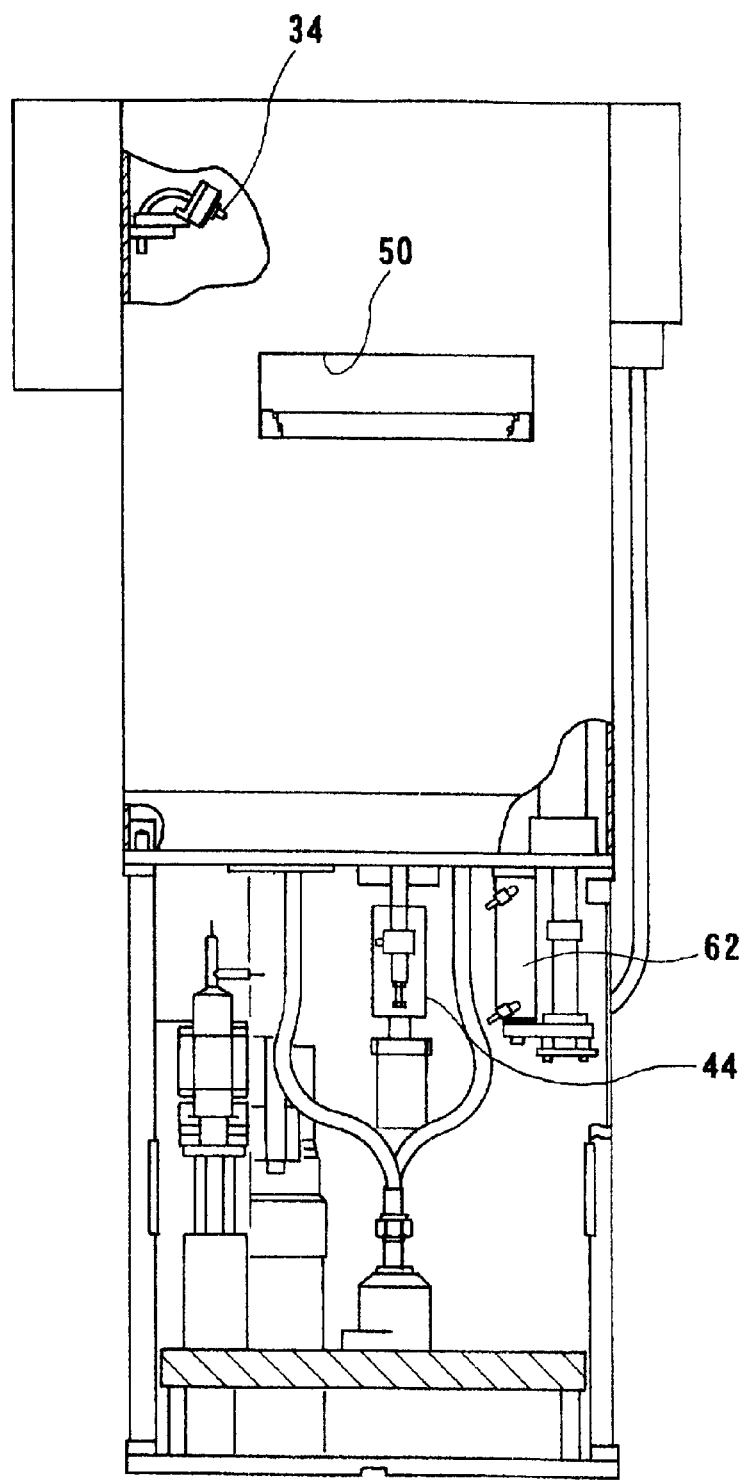
FIG. 7 is a right side view of FIG. 3.

The substrate holder 36 is adapted to be raised and lowered by the air cylinder 42 between a lower substrate transfer position A, an upper plating position B, and a pre-treatment/cleaning position C between these positions A and B, as shown in FIG. 5. The substrate holder 36 is also adapted to rotate at an arbitrary acceleration and an arbitrary velocity integrally with the cathode portion 38 by a rotating motor 46 and a belt 48 (see FIG. 4). A substrate carry-in and carry-out opening 50 is provided in confrontation with substrate transfer position A in a frame side surface of the plating unit 12 facing the transfer robot 14, as shown FIG. 7. When the substrate holder 36 is raised to plating position B, a seal member 90 and cathode electrodes 88 (to be described below) of the cathode portion 38 are brought into contact with a peripheral edge portion of substrate W held by the substrate holder 36. On the other hand, the cup 40 has an upper end located below the substrate carry-in and carry-out opening 50, and when the cup 40 ascends, the upper end of the cup 40 reaches a position above the cathode portion 38, thereby closing the substrate carry-in and carry-out opening 50, as shown by imaginary lines in FIG. 5.

Figure 6:
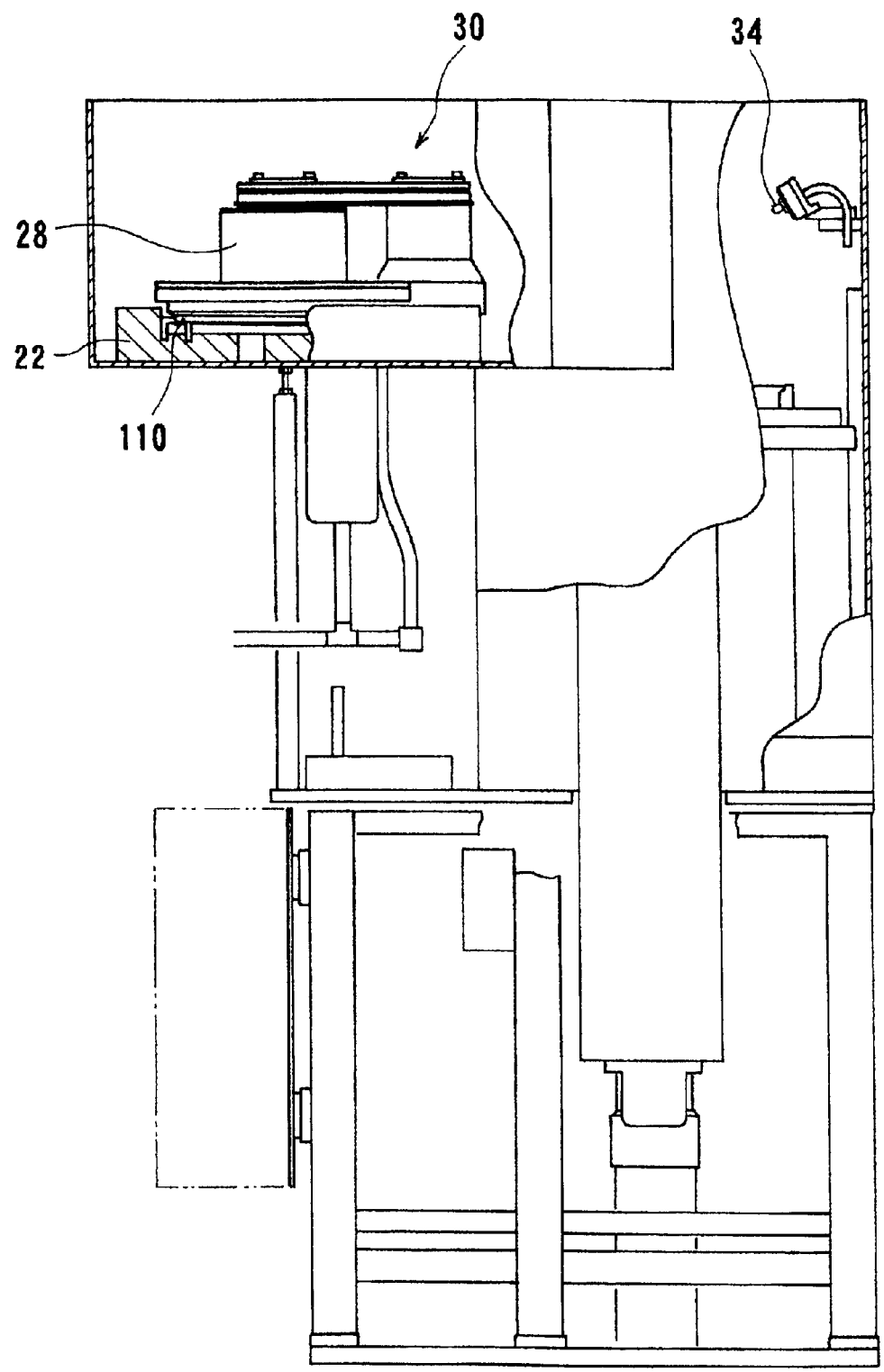
FIG. 6 is a front view of FIG. 3.

The plating liquid tray 22 serves to wet a plating liquid impregnation material 110 and an anode 98 (to be described later) of the electrode arm 30 with a plating liquid, when plating has not been performed. As shown in FIG. 6, the plating liquid tray 22 is set to a size at which the plating liquid impregnation material 110 can be accommodated, and the plating liquid tray 22 has a plating liquid supply port and a plating liquid drainage port (not shown). A photo-sensor is attached to the plating liquid tray 22, and can detect brimming with the plating liquid in the plating liquid tray 22, i.e., overflow and drainage. A bottom plate 52 of the plating liquid tray 22 is detachable, and a local exhaust port (not shown) is installed around the plating liquid tray.

Figure 8:
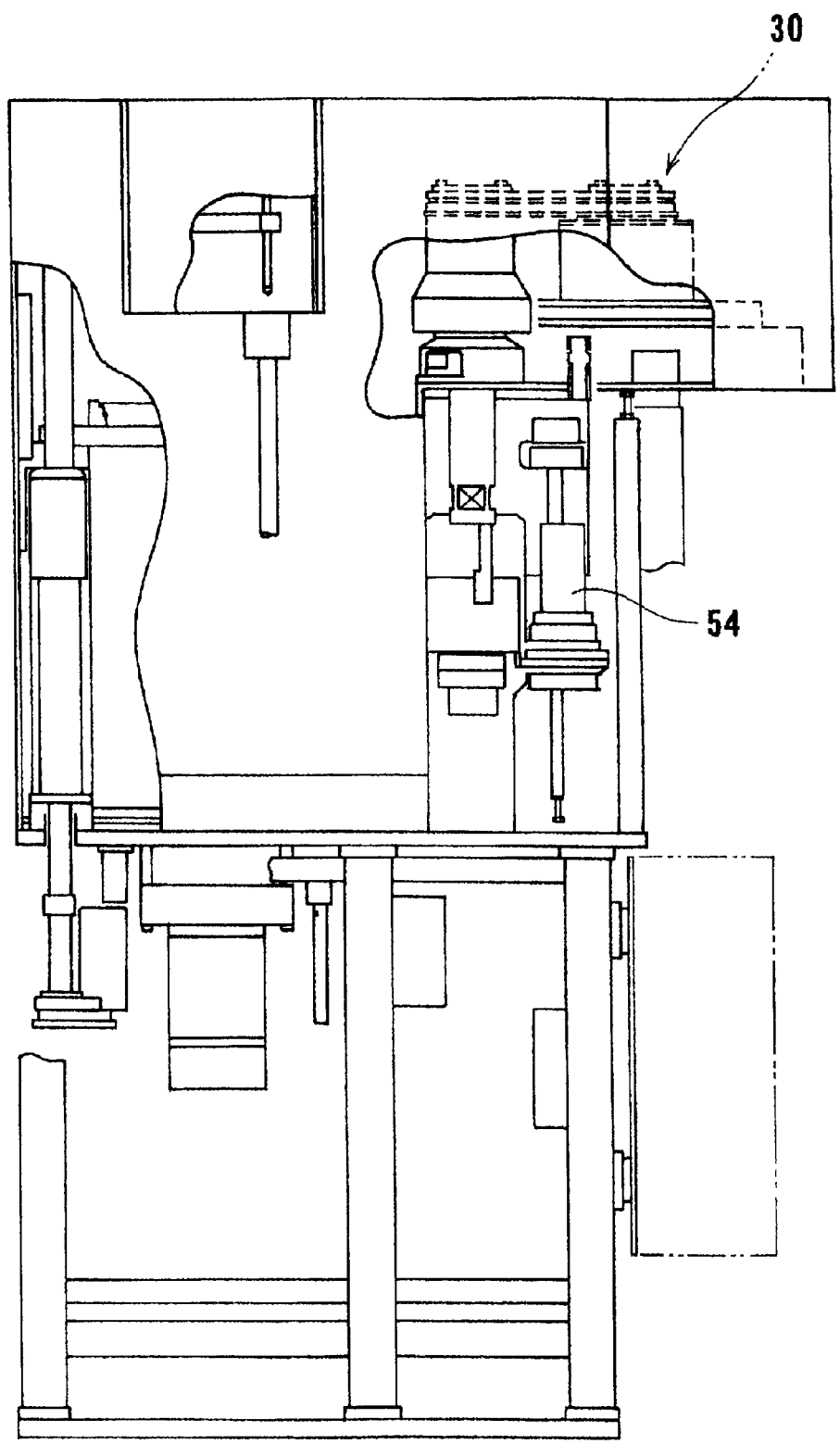
FIG. 8 is a rear view of FIG. 3.
Figure 9:
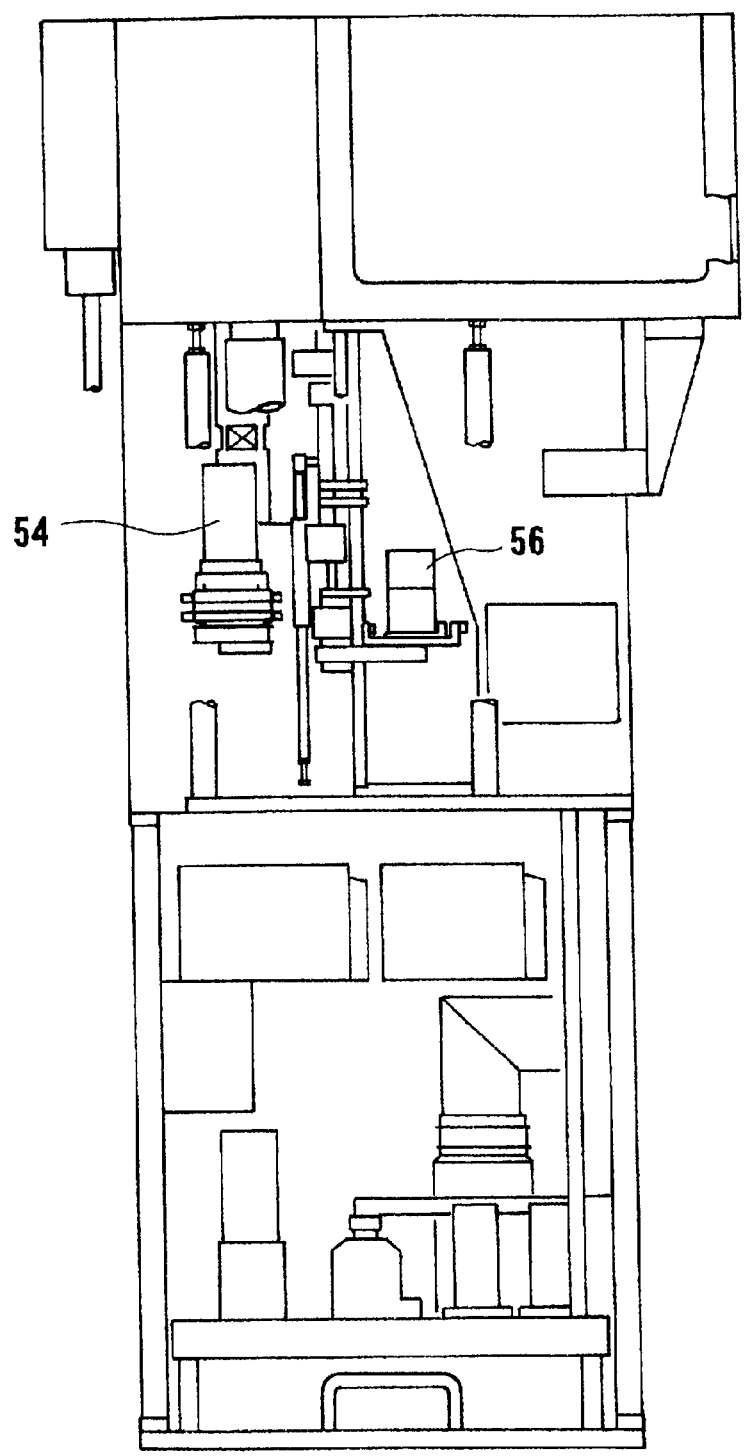
FIG. 9 is a left side view of FIG. 3.

As shown in FIGS. 8 and 9, the electrode arm 30 is vertically movable by a motor 54 and a ball screw, not shown, and swingable between the plating liquid tray 22 and the substrate treatment section 20 by a motor 56.

Figure 10:
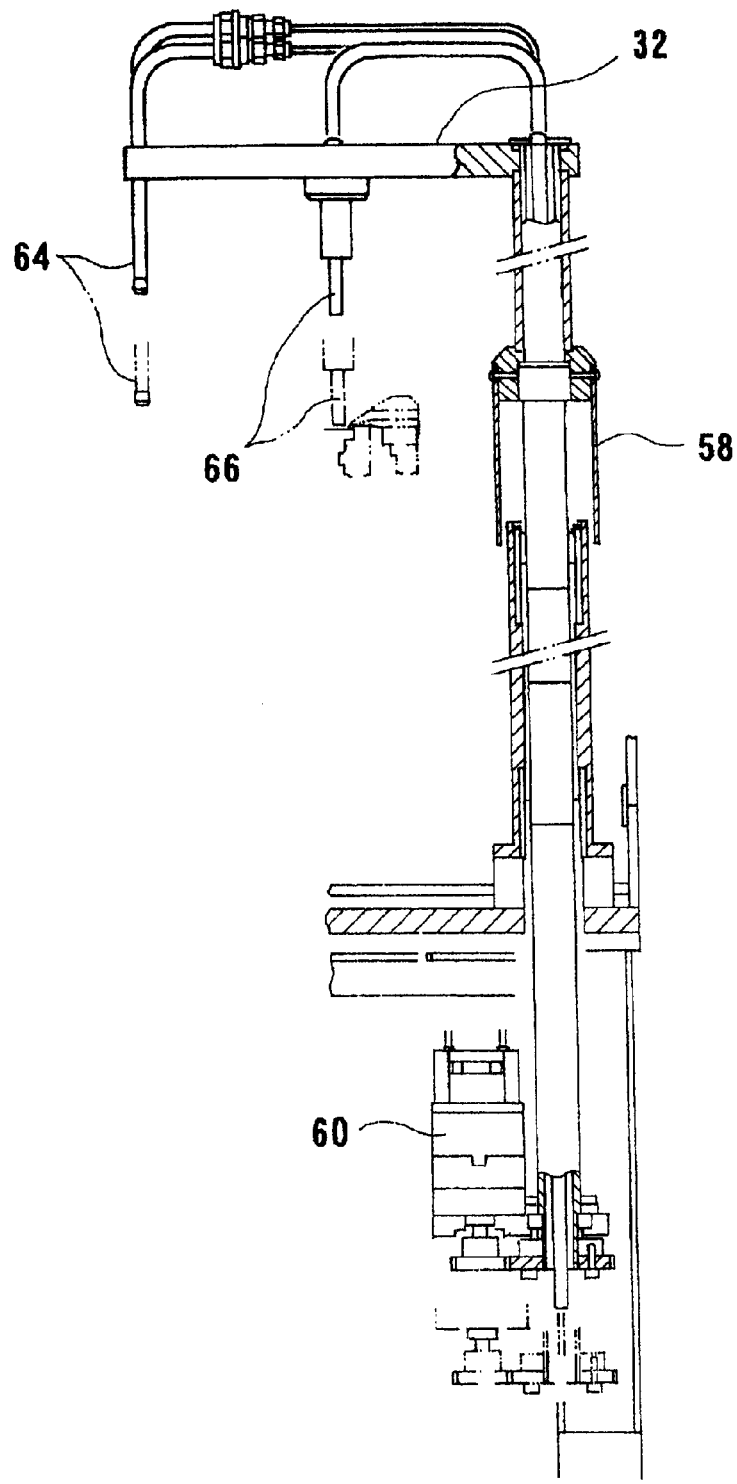
FIG. 10 is a front view showing a pre-coating/recovering arm.

As shown in FIG. 10, the precoating/recovering arm 32 is coupled to an upper end of a vertical support shaft 58. The precoating/recovering arm 32 is swingable by a rotary actuator 60 and is also vertically moveable by an air cylinder 62 (see FIG. 7). The pre-coating/recovering arm 32 supports a pre-coating nozzle 64 for discharging a pre-coating liquid, on its free end, and a plating liquid recovering nozzle 66 for recovering plating liquid, on a portion closer to its proximal end. The pre-coating nozzle 64 is connected to a syringe that is actuatable by an air cylinder, for example, for intermittently discharging a pre-coating liquid from the pre-coating nozzle 64.The plating liquid recovering nozzle 66 is connected to a cylinder pump or an aspirator, for example, to draw plating liquid on the substrate via the plating liquid recovering nozzle 66.

Figure 11:
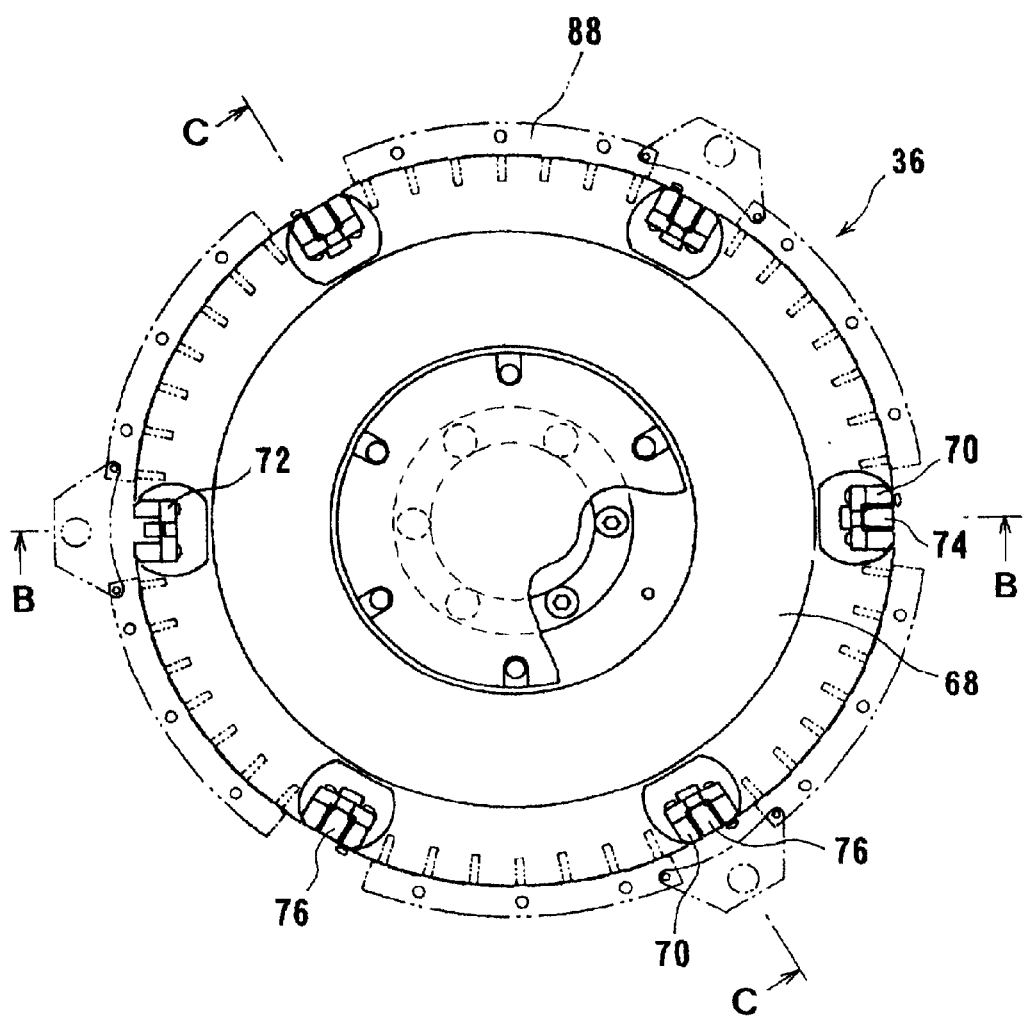
FIG. 11 is a plan view of the substrate holder.
Figure 12:
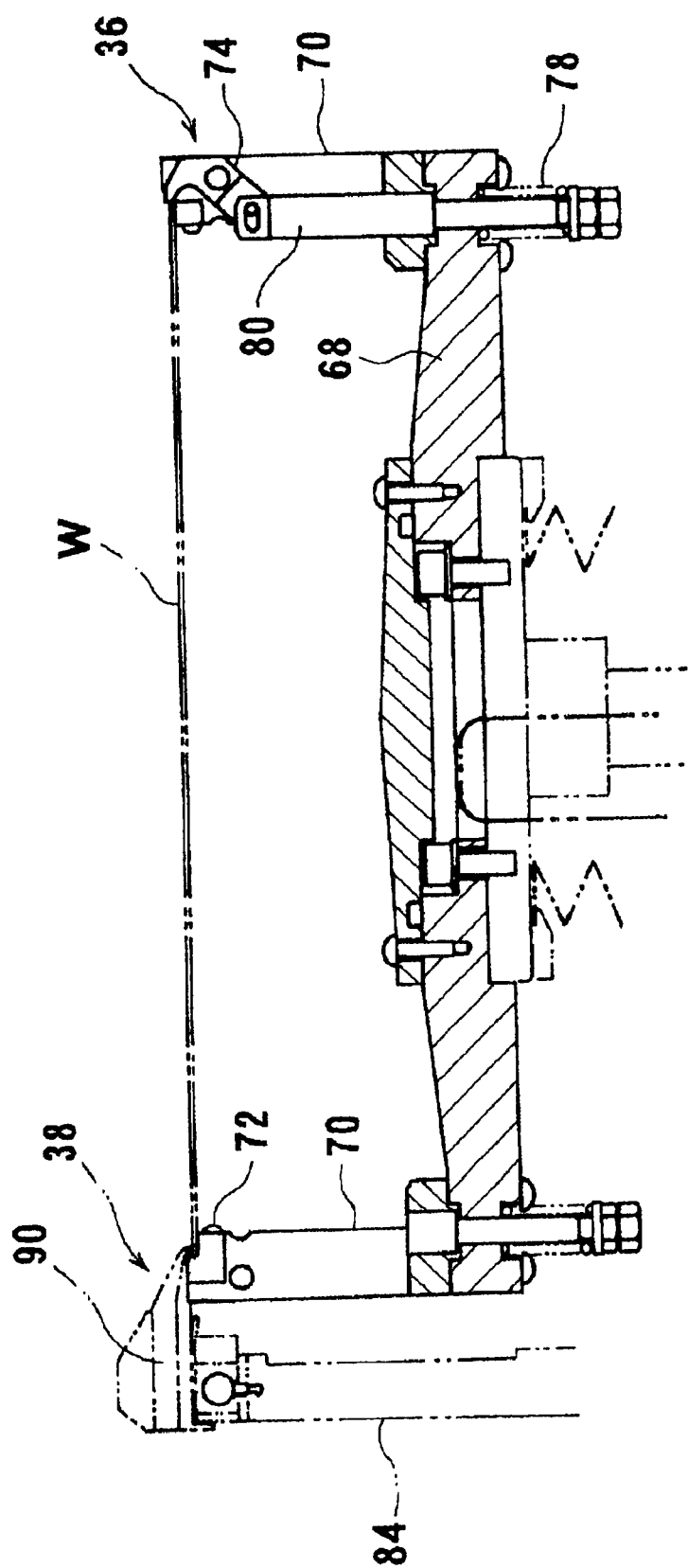
FIG. 12 is a sectional view taken along line B—B of FIG. 11.
Figure 13:
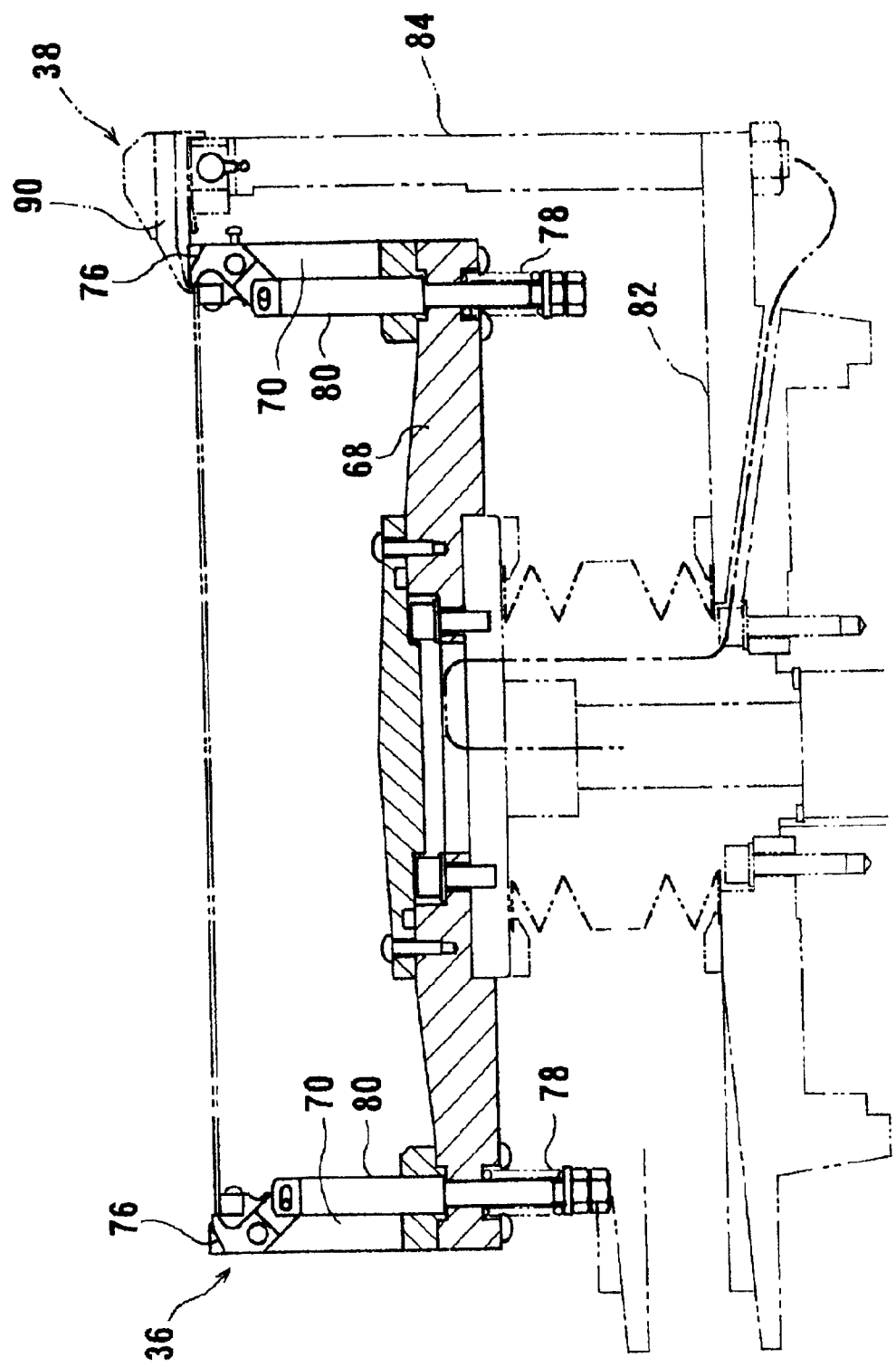
FIG. 13 is a sectional view taken along line C—C of FIG. 11.

As shown in FIGS. 11 through 13, the substrate holder 36 has a disk-shaped substrate stage 68 and six vertical support arms 70 disposed at spaced intervals on a circumferential edge of the substrate stage 68 for holding a substrate W in a horizontal plane on respective upper surfaces of the support arms 70. A positioning plate 72 is mounted on an upper end one of the support arms 70 for positioning the substrate by contacting an end face of the substrate. A pressing finger 74 is rotatably mounted on an upper end of the support arm 70 which is positioned opposite to the support arm 70 having the positioning plate 72, for abutting an end face of the substrate W and pressing the substrate W against the positioning plate 72 when rotated. Chucking fingers 76 are rotatably mounted on upper ends of the remaining four support arms 70 for pressing the substrate W downwardly and gripping a circumferential edge of the substrate W.

The pressing finger 74 and the chucking fingers 76 have respective lower ends coupled to upper ends of pressing pins 80 that are normally urged to move downwardly by coil springs 78. When the pressing pins 80 are moved downwardly, the pressing finger 74 and the chucking fingers 76 are rotated radially inwardly into a closed position. A support plate 82 is disposed below the substrate stage 68 for engaging lower ends of the pressing pins 80 and pushing them upwardly.

When the substrate holder 36 is located in substrate transfer position A shown in FIG. 5, the pressing pins 80 are engaged and pushed upwardly by the support plate 82, so that the pressing finger 74 and the chucking fingers 76 rotate outwardly and open. When the substrate stage 68 is elevated, the opening pins 80 are lowered under resiliency of the coil springs 78, so that the pressing finger 74 and the chucking fingers 76 rotate inwardly and close.

Figure 14:
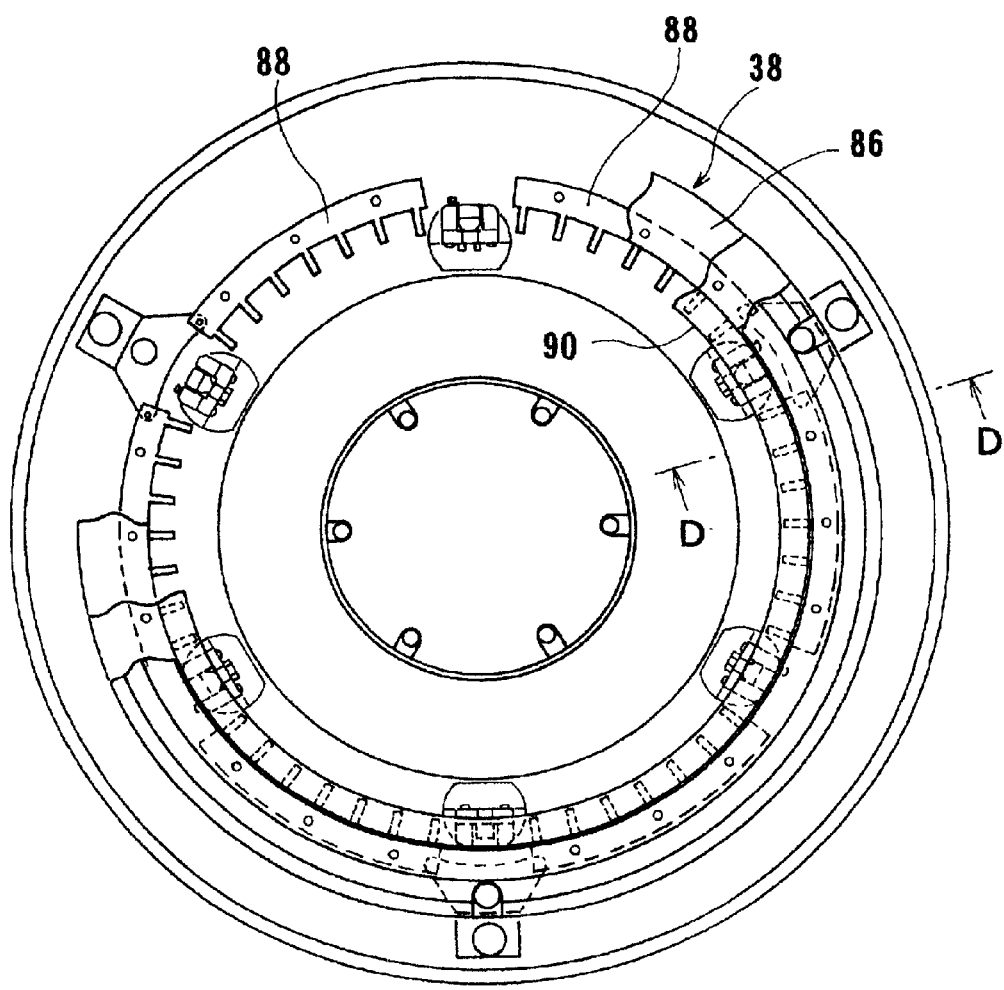
FIG. 14 is a plan view of the cathode portion.
Figure 15:
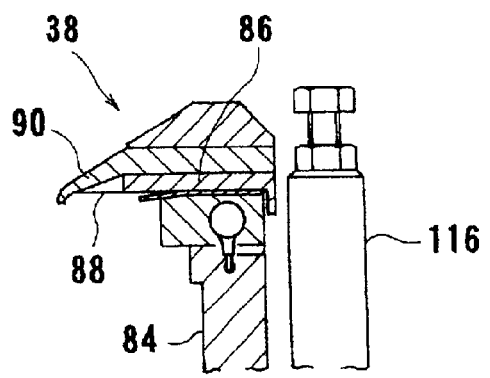
FIG. 15 is a sectional view taken along line D—D of FIG. 14.

As shown in FIGS. 14 and 15, the cathode portion 38 comprises an annular frame 86 fixed to upper ends of vertical support columns 84 mounted on a peripheral edge of the support plate 82 (see FIGS. 5 and 13), a plurality of, six in this embodiment, cathode electrodes 88 attached to a lower surface of the annular frame 86 and projecting inwardly, and an annular sealing member 90 mounted on an upper surface of the annular frame 86 in covering relation to upper surfaces of the cathode electrodes 88. The sealing member 90 is adapted to have an inner peripheral edge portion inclined inwardly downwardly and progressively thinned, and to have an inner peripheral end suspending downwardly.

When the substrate holder 36 has ascended to plating position B, as shown in FIG. 5, the cathode electrodes 88 are pressed against a peripheral edge portion of substrate W held by the substrate holder 36 for thereby causing electric current to flow through the substrate W. At the same time, an inner peripheral end portion of the seal member 90 is brought into contact with an upper surface of the peripheral edge of the substrate W under pressure to seal its contact portion in a watertight manner. As a result, plating liquid supplied onto an upper surface (surface to be plated) of the substrate W is prevented from seeping from an end portion of the substrate W, and the plating liquid is prevented from contaminating the cathode electrodes 88.

In the present embodiment, the cathode portion 38 is vertically immovable, but rotatably integrated with the substrate holder 36. However, the cathode portion 38 may be arranged such that it is vertically movable and the sealing member 90 is pressed against a surface, to be plated, of substrate W when the cathode portion 38 is lowered.

As shown in FIGS. 16 through 20, the electrode head 28 of the electrode arm 30 comprises a housing 94 coupled to a free end of the swing arm 26 through a ball bearing 92, a cylindrical support frame 96 surrounding the housing 94, and an anode 98 fixed by having a peripheral edge portion thereof gripped between the housing 94 and the support frame 96. The anode 98 covers an opening of the housing 94, which has a suction chamber 100 defined therein. In the suction chamber 100, there is disposed a diametrically extending plating liquid introduction pipe 104 connected to a plating liquid supply pipe 102 which extends from the plating liquid supply unit 18 (see FIG. 2), and held in abutment with an upper surface of the anode 98. A plating liquid discharge pipe 106 communicating with the suction chamber 100 is connected to the housing 94.

The plating liquid introduction pipe 104 is effective to supply plating liquid uniformly to a surface, to be plated, of substrate W if the plating liquid introduction pipe 104 is of a manifold structure. Specifically, the plating liquid introduction pipe 104 has a plating liquid introduction passage 104*a* extending continuously in its longitudinal direction, and a plurality of plating liquid introduction ports 104*b* spaced at a given pitch along the plating liquid introduction passage 104*a* and extending downwardly therefrom in communication therewith. The anode 98 has a plurality of plating liquid supply ports 98*a* defined therein at positions corresponding to the plating liquid introduction ports 104*b*. The anode 98 also has a number of vertically extending through holes 98*b* defined therein over its entire region. Plating liquid that is introduced from the plating liquid supply pipe 102 into the plating liquid introduction pipe 104 flows through the plating liquid introduction ports 104*b* and the plating liquid supply ports 98*a* to a plating space 99 (see FIG. 17) formed between the anode 98 and substrate W. The plating liquid discharge pipe 106 is evacuated to discharge the plating liquid within the plating space 99 formed between the anode 98 and the substrate W via the through holes 98*b* and the suction chamber 100 from the plating liquid discharge pipe 106.

Further, a liquid supply pipe 120 for separately introducing a solution or plating liquid, having a different additive concentration from the plating liquid, into the plating space 99 formed between the anode 98 and the substrate W is connected to the housing 94. By introducing into the plating space 99 from the liquid supply pipe 120, during a plating process, a solution or plating liquid having a different additive concentration a change of additive concentration in plating liquid contained in the plating space 99 can arbitrarily be controlled.

Figure 17:
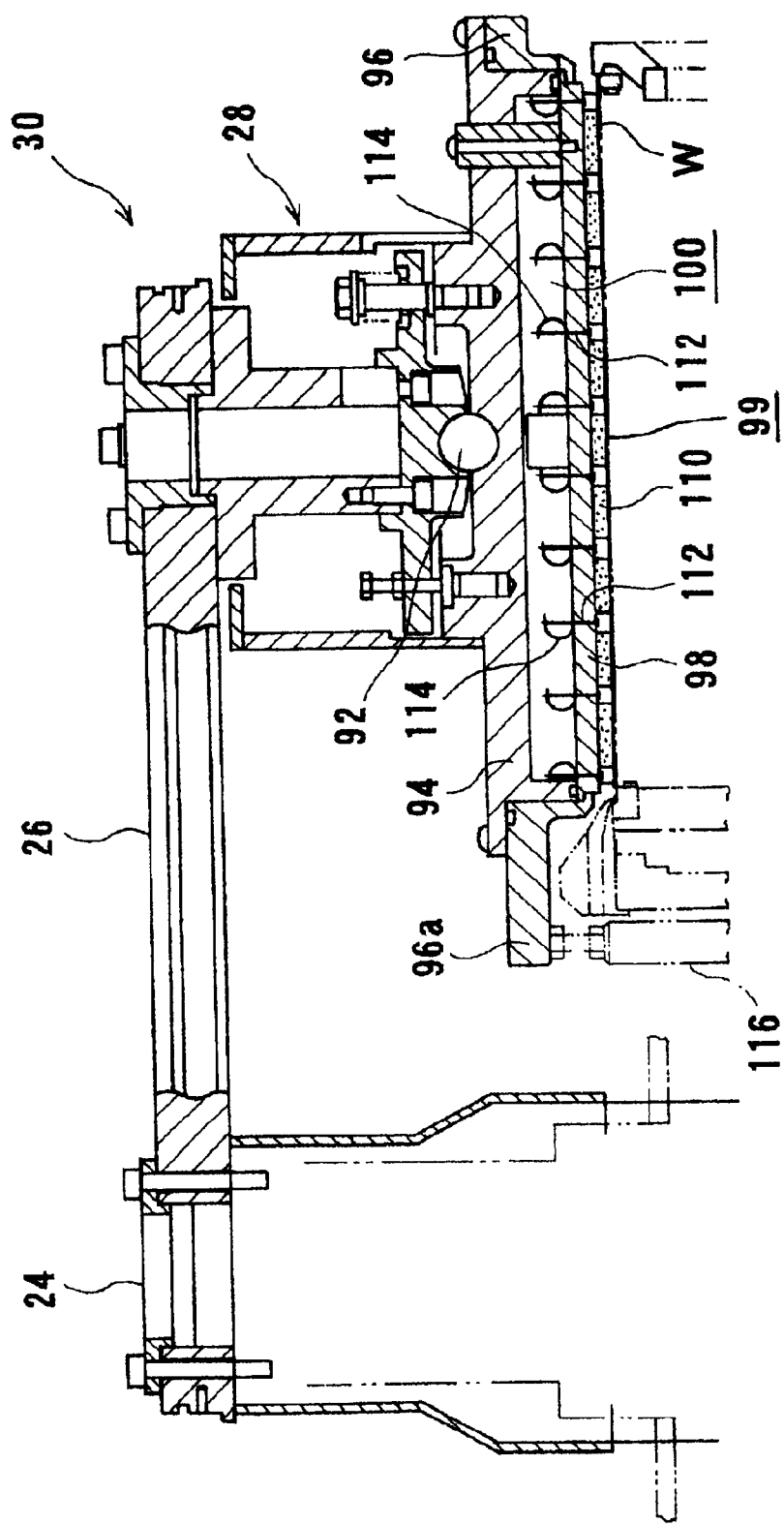
FIG. 17 is a longitudinal sectional front view of FIG. 16.
Figure 18:
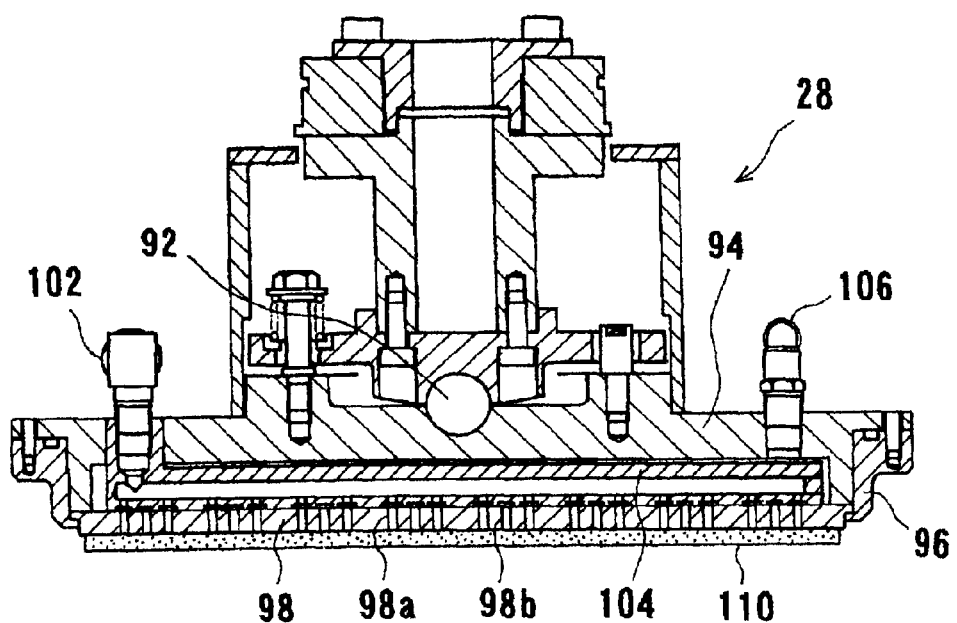
FIG. 18 is a sectional view taken along line E—E of FIG. 16.
Figure 19:
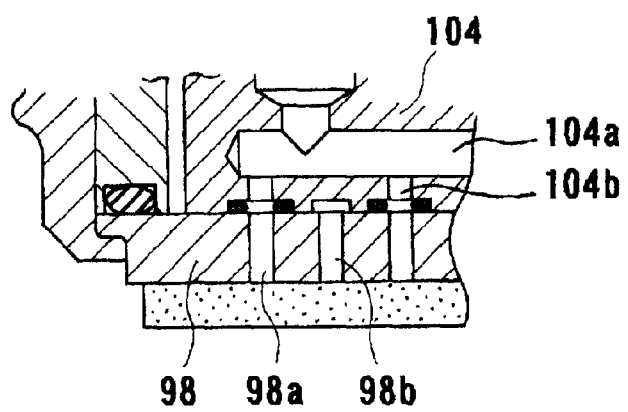
FIG. 19 is an enlarged view showing a part of FIG. 18 in an enlarged manner.
Figure 20:
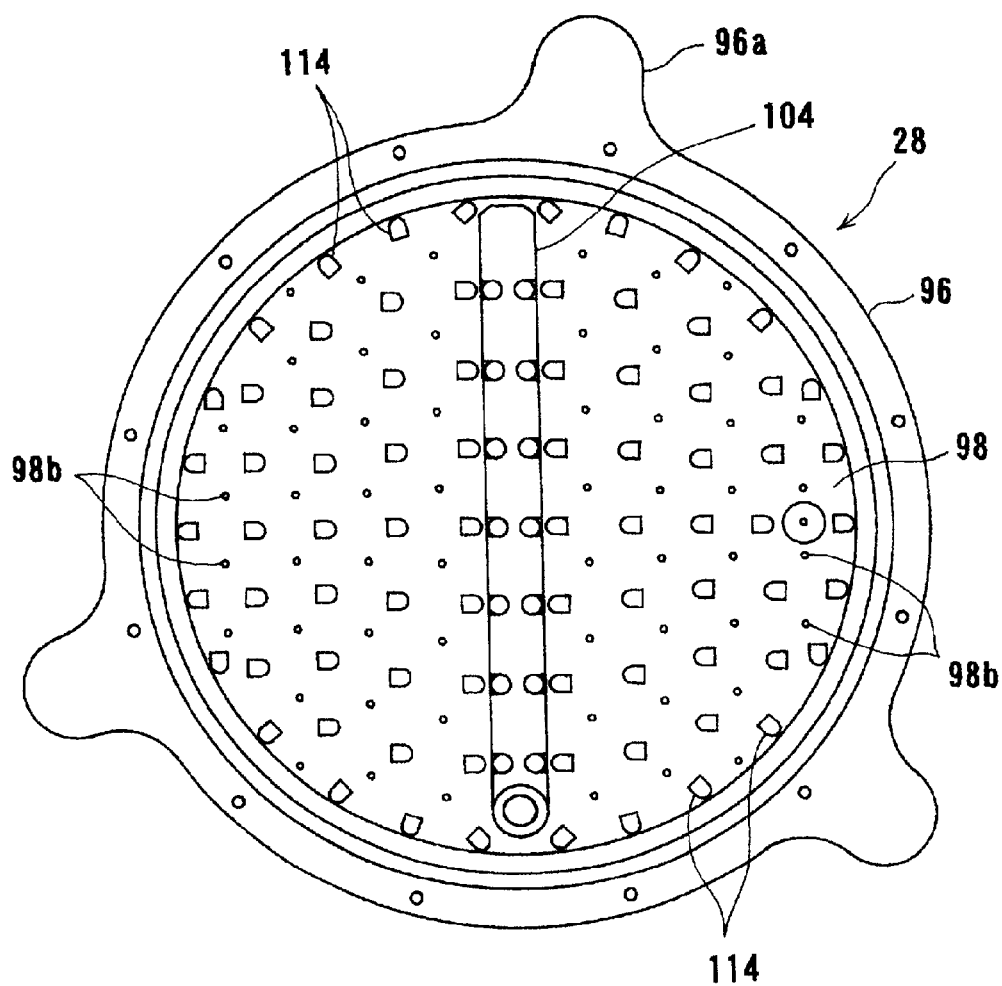
FIG. 20 is a plan view of a state in which a housing of an electrode portion of the electrode arm has been removed.

As shown in FIG. 17, the anode 98 is designed to have substantially the same size (diameter) as substrate W so that the anode covers substantially an entire surface of the substrate W.

In order to suppress generation of slime, the anode 98 is made of copper containing 0.03 to 0.05% phosphorus (phosphorus copper). When the anode 98 is made of phosphorus copper, a black film is formed on a surface of the anode 98 as a plating process progresses. The black film is made of a $Cu^+$ complex containing phosphorus and Cl, and comprises $Cu_2Cl_2$. $Cu_2O$ . $Cu_3P$, and the like. Since the black film suppresses a copper disproportionation reaction, it is important to stably form the black film on the surface of the anode 98 for a purpose of stabilizing the plating process. However, if the black film is dried and oxidized, and peeled off the anode 98, then it tends to produce particles and causes a change in composition of a plating.

In this embodiment, a plating liquid impregnation material 110 comprising a water retaining material and covering an entire surface of the anode 98 is attached to a lower surface of the anode 98. The plating liquid impregnation material 110 is impregnated with plating liquid to wet the lower surface of the anode 98, thereby preventing a black film from falling onto a plated surface of a substrate by drying and oxidizing, and simultaneously facilitating escape of air to an exterior when the plating liquid is poured between the surface, to be plated, of the substrate and the anode 98.

Further, by attaching the plating liquid impregnation material 110 to the anode 98 and contacting the material 110 with plating liquid poured into the plating space 99 between a surface, to be plated, of substrate W and the anode 98, a particular additive component, e.g. a leveler, can be adsorbed and removed by the plating liquid impregnation material 110. Use of the plating liquid impregnation material is thus effective for reducing leveler concentration of plating liquid in the plating space 99.

The plating liquid impregnation material 110 has both functions of retaining liquid and passing liquid therethrough, and has excellent chemical resistance. Specifically, the plating liquid impregnation material 110 has endurance against an acid plating liquid including sulfuric acid having high concentration. The plating liquid impregnation material 110 comprises, for example, a woven fabric of polypropylene to prevent elution of impurities in a sulfuric acid solution from having a bad influence on plating efficiency (plating speed, resistivity and filling characteristics). The plating liquid impregnation material 110 may comprise at least one material of polyethylene, polyester, polyvinyl chloride, Teflon, polyvinyl alcohol, polyurethane, and derivatives of these materials, other than polypropylene. Nonwoven fabric or a sponge-like structure may be used in place of woven fabric. Porous ceramics and sintered polypropylene made of alumina and SiC, and the like, are available.

That is, many fixing pins 112 each having a head portion at a lower end thereof are arranged such that the head portion is provided in the plating liquid impregnation material 110 so as not to be releasable upwardly, and a shaft portion of the fixing pin pierces an interior of the anode 98. Also, the fixing pins 112 are urged upwardly by U-shaped plate springs 114, whereby the plating liquid impregnation material 110 is brought into close contact with the lower surface of the anode 98 by resilient force of the plate springs 114 and is attached to the anode 98. With this arrangement, even when thickness of the anode 98 gradually deceases with progress of plating, the plating liquid impregnation material 110 can be reliably brought into close contact with the lower surface of the anode 98. Thus, air can be prevented from entering between the lower surface of the anode 98 and the plating liquid impregnation material 110 so as to not cause poor plating.

Incidentally, columnar pins made of PVC (polyvinyl chloride) or PET and having a diameter of, for example, about 2 mm may be arranged from an upper surface side of the anode 98 so as to pierce the anode, and an adhesive may be applied to a front end surface of each of the pins projecting from the lower surface of the anode to fix the anode to the plating liquid impregnation material 110. When the plating liquid impregnation material 110 has a sufficient strength, such as that associated with ceramics, the anode 98 may be placed on the plating liquid impregnation material fixed to a supporter without using pins for fixing the impregnation material. It is not necessary to bring into close contact the plating liquid impregnation material 110 with the anode 98, and a plating liquid may be filled into a gap between the plating liquid impregnation material and the anode.

When the substrate holder 36 is in plating position B (see FIG. 5), the electrode head 28 is lowered until a gap between substrate W held by the substrate holder 36 and the plating liquid impregnation material 110 becomes about 0.5 to 3 mm, for example. Then, plating liquid is supplied from the plating liquid supply pipe 102 to fill a gap between an upper surface, to be plated, of the substrate W and the anode 98 while impregnating the plating liquid impregnation material 110 with plating liquid, thereby plating the upper surface of the substrate W.

Figure 16:
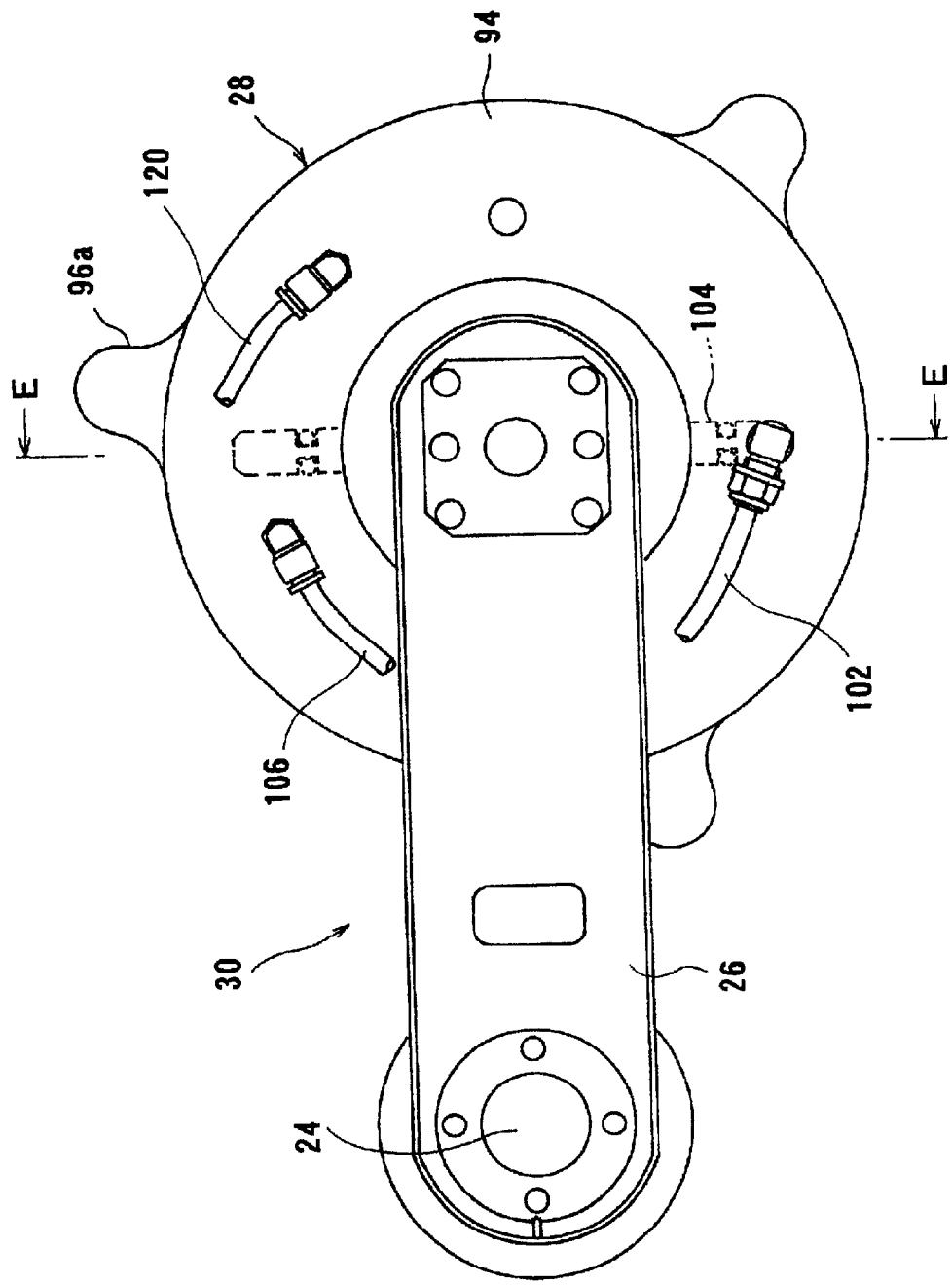
FIG. 16 is a plan view of an electrode arm.

As shown in FIG. 4, stopper bars 116 are erected outwardly of the support columns 84 supporting the cathode portion 38. As shown in FIGS. 16 and 17, protrusions 96a provided on a periphery of the support frame 96 are brought into contact with upper surfaces of the stopper bars 116, whereby descent of the electrode portion 28 is controlled.

A plating process carried out by the substrate plating apparatus according to the above embodiment will be described below.

First, a substrate W, to be plated, is removed from one of the loading/unloading units 10 by the transfer robot 14, and transferred, with a surface to be plated oriented upwardly, through substrate carry-in and carry-out opening 50 defined in a side panel, into one of the plating units 12. At this time, substrate holder 36 is in lower substrate transfer position A. After a hand of the transfer robot 14 has reached a position directly above substrate stage 68, the hand of the transfer robot 14 is lowered to place the substrate W onto support arm 70. The hand of the transfer robot 14 is then retracted through the substrate carry-in and carry-out opening 50.

After the hand of the transfer robot 14 is retracted, cup 40 is elevated. Then, the substrate holder 36 is lifted from substrate transfer position A to pre-treating/cleaning position C. As the substrate holder 36 ascends, the substrate W placed on support arms 70 is positioned by positioning plate 72 and pressing finger 74, and then reliably gripped by fixing fingers 76.

On the other hand, electrode head 28 of electrode arm 30 is now in a normal position over plating liquid tray 22, and plating liquid impregnation material 110 or anode 98 is positioned in the plating liquid tray 22. At the same time that the cup 40 ascends, plating liquid starts being supplied to the plating liquid tray 22 and the electrode head 28. Until a step of plating the substrate W is initiated, new plating liquid is supplied, and plating liquid discharge pipe 106 is evacuated to replace plating liquid in the plating liquid impregnation material 110 and remove air bubbles from the plating liquid in the plating liquid impregnation material 110. When ascending movement of the cup 40 is completed, the substrate carry-in and carry-out opening 50 in the side panel is closed by the cup 40, thereby isolating an atmosphere interior of the side panel and an atmosphere exterior of the side panel from each other.

When the cup 40 is elevated, a pre-coating step is initiated. Specifically, the substrate holder 36 that has received the substrate W is rotated, and pre-coating/recovering arm 32 is moved from a retracted position to a position confronting the substrate W. When rotational speed of the substrate holder 36 reaches a setting value, pre-coating nozzle 64 mounted on a tip end of the pre-coating/recovering arm 32 intermittently discharges a pre-coating liquid which comprises a surface active agent, for example, toward the surface to be plated of the substrate W. At this time, since the substrate holder 36 is rotating, the pre-coating liquid spreads all over the surface, to be plated, of the substrate W. Then, the pre-coating/recovering arm 32 is returned to the retracted position, and rotational speed of the substrate holder 36 is increased to spin the pre-coating liquid off and dry the surface, to be plated, of the substrate W.

After completion of the precoating step, a plating step is initiated. First, rotation of the substrate holder 36 is stopped, or rotational speed thereof is reduced to a preset rotational speed for plating. In this state, the substrate holder 36 is lifted to plating position B. Then, a peripheral edge of the substrate W is brought into contact with cathode electrodes 88, when it is possible to cause an electric current to flow, and at the same time, sealing member 90 is pressed against an upper surface of the peripheral edge of the substrate W, thereby sealing the peripheral edge of the substrate W in a water-tight fashion.

Based on a signal indicating that the pre-coating step for loaded substrate W is completed, the electrode arm 30 is swung in a horizontal direction to displace the electrode head 28 from a position over the plating liquid tray 22 to a position over a plating position. After the electrode head 28 reaches this position, the electrode head 28 is lowered toward cathode portion 38. At this time, the plating liquid impregnation material 110 does not contact with the surface, to be plated, of the substrate W, but is held closely to the surface, to be plated, of the substrate W at a distance ranging from 0.5 mm to 3 mm. When descent of the electrode head 28 is completed, a plating current is applied, and plating liquid is supplied from plating liquid supply pipe 102 into the electrode head 28, and then from plating liquid supply ports 98a through the anode 98 to the plating liquid impregnation material 110.

When supply of the plating liquid continues, the plating liquid containing copper ions, which has seeped out of the plating liquid impregnation material 110, is filled into a gap between the plating liquid impregnation material 110 and the surface, to be plated, of the substrate W so that copper plating is performed on the surface, to be plated, of the substrate.

After supplying a predetermined amount of plating liquid, introduction of the plating liquid is stopped, and the substrate holder 36 is rotated at a low speed so that the plating liquid can be supplied evenly to the surface, to be plated, of the substrate. Rotation of the substrate holder is continued e.g. for 5 minutes. Plating liquid used in this embodiment contains an additive concentration of e.g. 1.0 mL/L, and is used in an amount of e.g. 50 mL according to a volume of plating space 99. The additive concentration decreases with progress of the plating process, whereby unevenness in a plated film thickness between an interconnection region and an non-interconnection region is corrected.

More specifically, during plating of the substrate, the additive concentration gradually decreases with progress of plating due to take-in of the additive within a deposited metal film and oxidation degradation at the anode 98. A change (decrease) in additive concentration of plating liquid contained in the plating space 99 formned between the substrate and the anode 98 is large in such cases as this embodiment, where plating of the substrate is by a close-to-anode plating wherein an amount of plating liquid itself in the plating space 99 is small, and introduction of plating liquid into the plating space 99 is conducted only before plating, and not conducted during the plating process. This effectively corrects unevenness in the plated film thickness between the interconnection region and the non-interconnection region. Further, use of the plating liquid impregnation material 110 can adsorb and remove a particular additive compound, e.g. a leveler, thereby more effectively reducing a leveler concentration of plating liquid contained in the plating space 99.

Though in this embodiment introduction of plating liquid into the plating space 99 is conducted only before a plating process (batch-wise introduction), the plating liquid may be introduced intermittently during the plating process. Further, by separately introducing during the plating process, a solution or plating liquid having a different additive concentration, into the plating space 99 from the liquid supply pipe 120, a change of additive concentration in plating liquid contained in the plating space 99 can be made larger.

When the plating treatment is completed, the electrode arm 30 is raised and then swung to return to a position above the plating liquid tray 22 and to lower to an ordinary position. Then, the pre-coating/recovering arm 32 is moved from a retreat position to the position confronting the semiconductor substrate W, and lowered to recover a remainder of plating liquid on the substrate W via plating liquid recovering nozzle 66. After recovery of the remainder of the plating liquid is completed, the pre-coating/recovering arm 32 is returned to the retreat position, and pure water is supplied from fixed nozzle 34 for supplying pure water toward a central portion of the substrate W for rinsing a plated surface of the substrate. At the same time, the substrate holder 36 is rotated at an increased speed to replace plating liquid on the surface of the substrate W with pure water. Rinsing the substrate W in this manner prevents splashing plating liquid from contaminating the cathode electrodes 88 of the cathode portion 38 during descent of the substrate holder 36 from plating position B.

After completion of rinsing, a washing with water step is initiated. That is, the substrate holder 36 is lowered from plating position B to pre-treatment/cleaning position C. Then, while pure water is supplied from the fixed nozzle 34, the substrate holder 36 and the cathode portion 38 are rotated to perform washing with water. At this time, the seal member 90 and the cathode electrodes 88 can also be cleaned, simultaneously with substrate W, by virtue of pure water directly supplied to the cathode 38, or pure water scattered from a surface of the substrate W.

After washing with water is completed, a drying step is initiated. That is, supply of pure water from the fixed nozzle 34 is stopped, and a rotational speed of the substrate holder 36 and the cathode portion 38 is further increased to remove pure water on the surface of the substrate W by centrifugal force, and to dry the surface of the substrate W. The seal member 90 and the cathode electrodes 88 are also dried at the same time. Upon completion of drying, rotation of the substrate holder 36 and the cathode portion 38 is stopped, and the substrate holder 36 is lowered to substrate transfer position A. Thus, gripping of the substrate W by the fixing fingers 76 is released, and the substrate W is just placed on upper surfaces of the support arms 70. At the same time, the cup 40 is also lowered.

All steps including the plating step, the pre-treating step accompanying the plating step, the cleaning step, and the drying step are now finished. The transfer robot 14 inserts its hand through the substrate carry-in and carry-out opening 50 and to a position beneath the substrate W, and raises the hand to receive processed substrate W from the substrate holder 36. Then, the transfer robot 14 returns the processed substrate W, received from the substrate holder 36, to one of the loading/unloading units 10.

This embodiment shows a case where plating is carried out at a constant temperature. In this case, though additive concentration of the plating liquid decreases until the plating liquid impregnation material 110 reaches adsorption saturation, this effect can no longer be expected after adsorption saturation. Accordingly, for example, a device for adjusting a temperature of plating liquid during a plating process, such as a heater, may be provided around the anode 98 so as to gradually raise a plating temperature in accordance with progress of a plating process, whereby adsorption capacity of the plating liquid impregnation material 110 for an additive in the plating liquid can be enhanced. It is also possible to utilize spontaneous temperature rising due to Joule heat that generates during a plating process. In this case, after completion of plating, the plating liquid impregnation material 110 may be brought into contact with a low-temperature plating liquid to detach part of an adsorbed additive. An additive excessively adsorbed due to high temperature can thus be detached.

Further, the plating apparatus may be arranged such that a plurality of plating liquids having different additive concentrations can be introduced, through the plating liquid supply pipe 102, into the space between a surface, to be plated, of a substrate and the anode 98. Plating may be conducted by using, at an initial stage of a plating process, a plating liquid having a proper additive concentration for metal filling into interconnections, and replacing the plating liquid with other plating liquids having lower additive concentrations at a middle or later stage of the plating process, thereby adjusting additive concentration of the plating liquid during the plating process.

Adjustment of additive concentration during a plating process may also be made by using, at an initial stage of a plating process, an anode that holds a plating liquid impregnation material impregnated with a plating liquid having a proper additive concentration for metal filling, and using, at a middle or later stage of the plating process, an anode that holds a plating liquid impregnation material impregnated with a plating liquid having a lower additive concentration.

The following are results of various experiments which were conducted to show technical effects attained by the plating treatment according to this embodiment.

First, in order to examine a relationship between an amount of plating liquid and filling properties, plating was conducted with various amounts of plating liquid under the following plating conditions to determine additive concentration at initial, middle and later stages of a plating process, a film-thickness difference between interconnection and non-interconnection regions, and presence or absence of voids in interconnections. The results are shown in Table 1.

Plating Conditions

Copper sulfate pentahydrate=225 g/L, Sulfuric acid=55 g/L, Chloride ion=60 mg/L, Additive=DMEC#40 (all manufactured by EBARA-UDYLITE CO., LTD.)

Temperature=25° C., Electric current density=20 mA/cm$^2$, Plating time=5 min (average thickness of plated film: 2000 nm)

Impregnation material: not used

TABLE I

Amount of plating liquid and filling properties

| Amount of Plating liquid (ml/substrate) | | 5 ml | 50 ml | 500 ml | 1000 ml | 5000 ml |
|---|---|---|---|---|---|---|
| Measured additive concentration (ml/l) | Initial stage (0 min) | 1.0 | 1.0 | 1.0 | 1.0 | 1.0 |
| | Middle stage (2.5 min) | 0 | 0 | 0.6 | 0.9 | 1.0 |
| | Later stage (5 min) | 0 | 0 | 0.1 | 0.5 | 0.9 |
| Film-thickness difference (nm) | (= Interconnection region − Non-interconnection region | 0 | 100 | 400 | 1000 | 1800 |
| Presence of voids in interconnection | | Found | None | None | None | None |

As can be seen from Table 1, use of a smaller amount of plating liquid results in a smaller difference in film thickness of a plated film between an interconnection region and a non-interconnection region, thereby providing a film-thickness distribution feasible for CMP processing. This is considered to be due to decrease in a brightener component which is a main cause of the film-thickness difference. Table 1 also shows that use of an extremely small amount of plating liquid results in formation of voids in the interconnection, and thus is not preferred. This may be due to shortage of the brightener component which is a main factor for bottom-up growth in via holes, which is important for metal filling into fine interconnections.

Next, in order to examine a change of additive concentration with or without use of a plating liquid impregnation material, plating was conducted under the following plating conditions to determine additive concentration at initial, middle and later stages of a plating process, a film-thickness difference between interconnection and non-interconnection regions, and presence or absence of voids in interconnections. The results are shown in Table 2.

Plating Conditions

Copper sulfate pentahydrate=225 g/L, Sulfuric acid=55 g/L, Chloride ion=60 mg/L, Additive=DMEC#40 (all manufactured by EBARA-UDYLITE CO., LTD.)

Temperature=25° C., Electric current density=20 mA/cm$^2$, Plating time=5 min (average thickness of plated film: 2000 nm)

Impregnation material: PVA sponge (thickness: 4 mm), previous additive-adsorption treatment not made Amount of plating liquid: 1000 mL/substrate

TABLE 2

Additive adjustment by adsorption by impregnation material

| | | With impregnation material | Without impregnation material |
|---|---|---|---|
| Measured additive concentration (ml/l) | Initial stage (0 min) | 1.0 | 1.0 |
| | Middle stage (2.5 min) | 0.2 | 0.9 |
| | Later stage (5 min) | 0 | 0.5 |
| Film-thickness difference (nm) | (=Interconnection region − Non-interconnection region) | 100–150 | 1000 |
| Presence of voids in interconnection | | None | None |

As can be seen from Table 2, by carrying out plating in the presence of a plating liquid impregnation material having additive-adsorbing properties, additive concentration can be effectively decreased during the plating process, whereby plating can be achieved with a smaller film-thickness difference and without formation of voids in interconnections. This is considered to be due to the fact that concentration of a brightener, which is necessary for interconnection filling, is high at the initial stage of the plating process, whereas at the middle or later stage of the plating process, the brightener concentration is lowered by adsorption by the plating liquid impregnation material.

Further, multistage plating using plating liquids having different additive concentrations and normal plating using a single plating liquid were conducted under the following plating conditions to determine additive concentration at initial, middle and later stages of the plating process, a film-thickness difference between interconnection and non-interconnection regions and presence or absence of voids in interconnections. The results are shown in Table 3.

Plating Conditions

Copper sulfate pentahydrate=225 g/L, Sulfuric acid=55 g/L, Chloride ion=60 mg/L, Additive=DMEC#40 (all manufactured by EBARA-UDYLITE CO., LTD.)

Temperature=25° C., Electric current density=20 mA/cm$^2$, Plating time=5 min (average thickness of plated film: 2000 nm)

Impregnation material: not used

Amount of plating liquid: 5000 mL/substrate, the additive concentration shown in Table 3

TABLE 3

Results of multistage plating

| | | Multistage plating(ml/l) 0–1.5 min: Concentration 1.0 1.5–3 min: Concentration 0.3 3–5 min: Concentration 0 | Normal (Single liquid) Concentration: 1.0ml/l |
|---|---|---|---|
| Measured additive concentration (ml/l) | Initial stage (0 min) | 1.0 | 1.0 |
| | Middle stage (2.5 min) | 0.3 | 1.0 |
| | Later stage (5 min) | 0 | 0.9 |

TABLE 3-continued

Results of multistage plating

|  |  | Multistage plating(ml/l) 0–1.5 min: Concentration 1.0 1.5–3 min: Concentration 0.3 3–5 min: Concentration 0 | Normal (Single liquid) Concentration: 1.0ml/l |
|---|---|---|---|
| Film-thickness difference (nm) | (=Interconnection region − Non-interconnection region) | 100–150 | 1800 |
| Presence of voids in interconnection |  | None | None |

As can be seen Table 3, by decreasing stepwise additive concentration of a plating liquid in accordance with progress of a plating process, a plated film having a small film-thickness difference, thus feasible for CMP processing, can be obtained.

As described hereinabove, according to this embodiment of the present invention, plating of a substrate can be performed with a small film-thickness difference between the interconnection and non-interconnection regions, which is feasible for later CMP processing, and without forming voids in the interconnections. This improves product yield, can simplify process steps and attains a considerable lowering of production costs.

Figure 21:
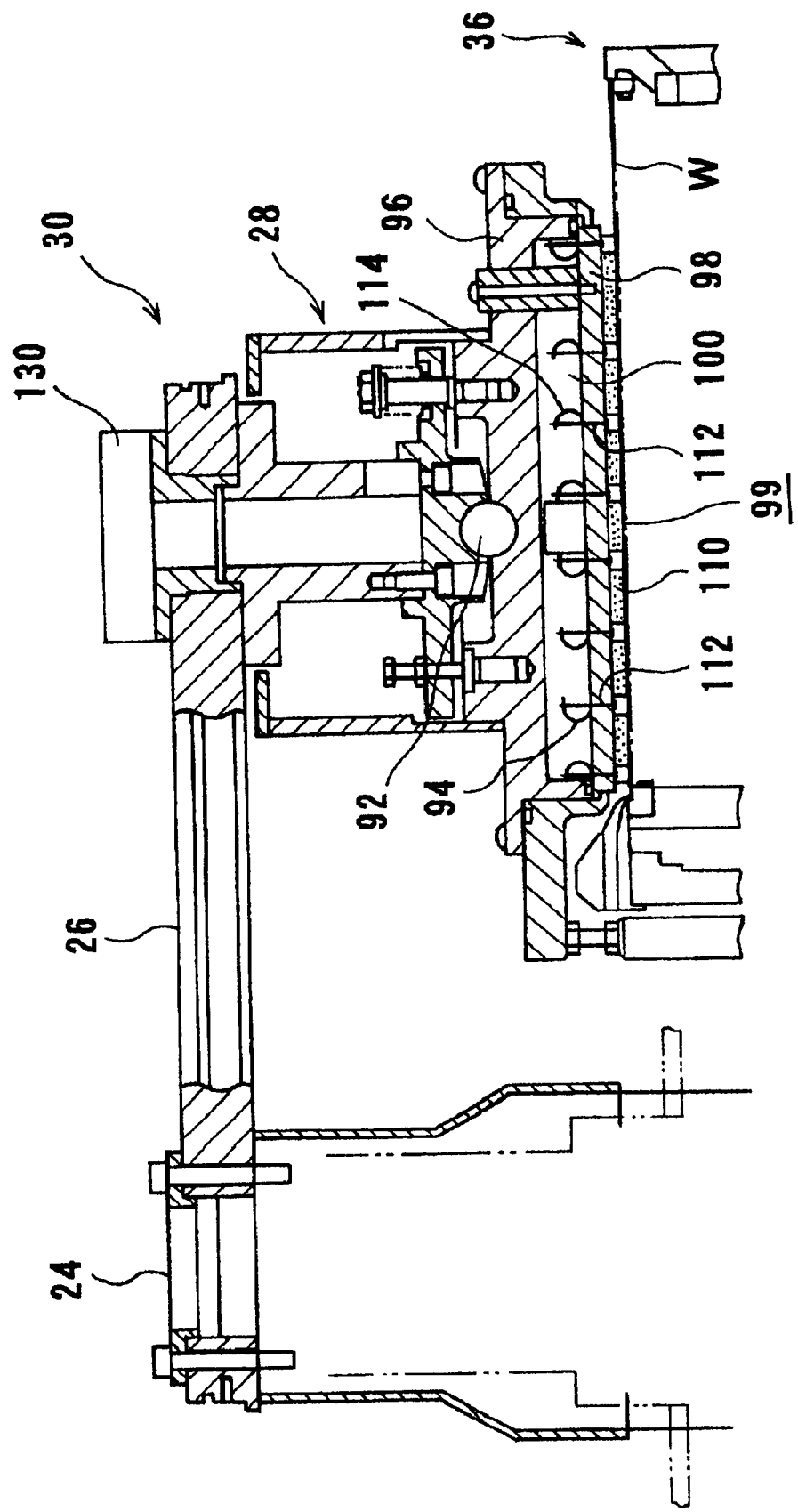
FIG. 21 is a longitudinal sectional front view of an electrode arm containing a substrate holder according to a second embodiment of the present invention.
Figure 22:
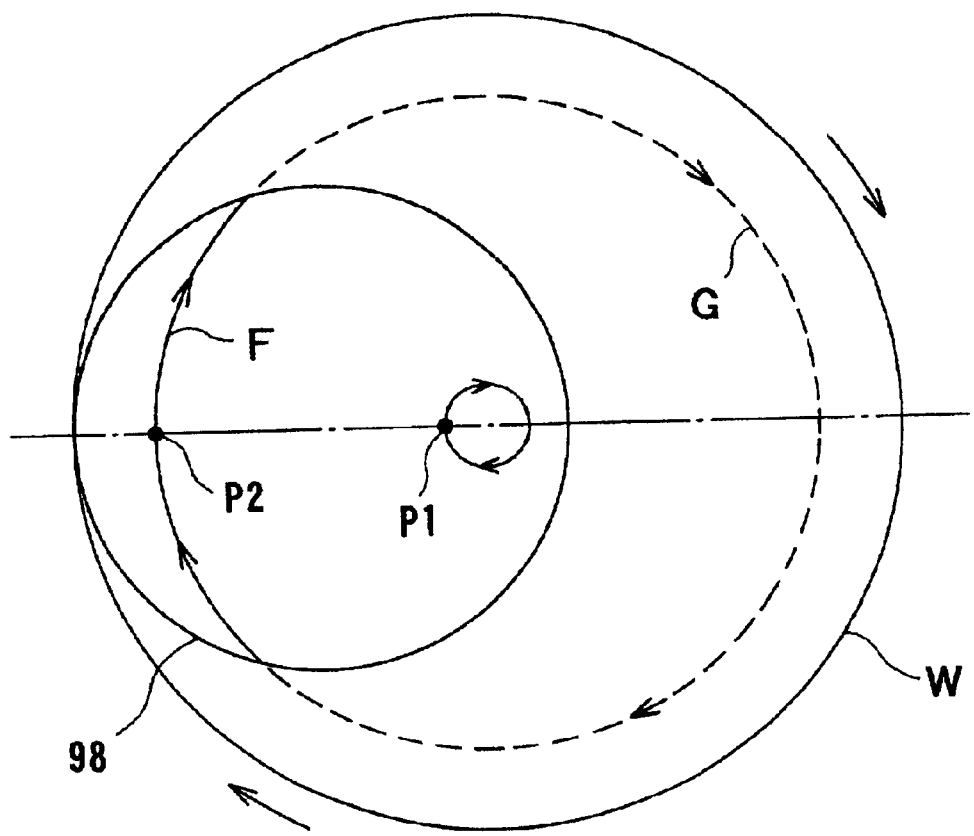
FIG. 22 is a plan view showing a relationship between a substrate and an anode according to the second embodiment of the present invention.

FIGS. 21 and 22 show a plating apparatus according to a second embodiment of the present invention. FIG. 21 is a longitudinal sectional front view of an electrode arm containing a substrate holder, and FIG. 22 is a plan view showing a relationship between a substrate and an anode.

According to the plating apparatus of this embodiment, a size (diameter) of anode 98 is designed to be smaller than a size (diameter) of substrate W, so that an area of the anode 98 becomes smaller than the area of the substrate W. Further, a rotary motor 130 as an anode-rotating device is provided at an upper end of electrode portion 28, so that the anode 98 is allowed to be rotated by the rotary motor 130. Other construction of this apparatus is substantially the same as the above described plating apparatus according to the first embodiment.

As described above, when a plating current flows, an electric current value on an inner central side of a substrate W is smaller than an electric current value on an outer peripheral side of the substrate due to a difference in sheet resistance of the substrate W. If energization time of the plating current can be made longer on the inner central side of the substrate W than on the outer peripheral side, it becomes possible to make a product of the electric current value and the energization time substantially equal to that of the inner central side and the outer peripheral side of the substrate W. Since film thickness of a plated film formed on a surface of substrate W is proportional to the product of the electric current value of the plating current and the energization time of the plating current, making the product equal as described above can provide a plated film having a uniform film thickness over an entire surface of the substrate.

According to the plating apparatus of this embodiment, adjustment of the energization time of the plating current, which realizes formation of a plated film having a uniform film thickness, is made by making the area of the anode 98 smaller than the area of the substrate W, and by driving the rotary motor 46 as a substrate-rotating device (see FIG. 4) to rotate substrate holder 36 together with the substrate W during a plating process.

Thus, when the substrate W is rotated, point P1 shown in FIG. 22, situated on an inner central side of the substrate, always faces the anode 98 and causes electric current to flow therethrough. On the other hand, with regard to point P2 situated on an outer peripheral side of the substrate, this point faces the anode 98 when it moves (rotates) along solid line F, but it does not face the anode 98, and electric current does not flow therethrough, when the point moves (rotates) along broken line G Accordingly, the energization time of the electric current becomes longer at point P1 than at point P2.

According to this embodiment, the energization time of the electric current on the inner central side of the substrate W is thus made longer than that on the outer peripheral side of the substrate by properly selecting shape, size, area and positioning of the anode 98, along with rotational speed of the substrate W, thereby making a product of the plating current value and the energization time of the plating current equal over an entire surface of the substrate W, whereby a plated film having a uniform film thickness can be formed. In addition, since the area of the anode 98 is made smaller than the area of the substrate W, it becomes possible to utilize a surface of the substrate W not facing the anode 98, i.e. an exposed surface of the substrate, to conduct an optical film-thickness measurement or the like simultaneously with formation of the plated film.

The cross-sectional area of the anode 98 is selected, as described above, so that a film thickness of the plated film may be made uniform over the entire surface of the substrate, and is preferably selected from the range of 25–95% of the area of the surface of substrate W. When the anode 98 is of a disc shape, if the cross-sectional area of the anode 98 is less than 25% of the cross-sectional area of the substrate, i.e. the diameter of the anode 98 is smaller than the radius of the substrate W, there should be a portion in the vicinity of a center of the surface of the substrate W that cannot be plated. Rotational speed of the substrate W is preferably 3–60 revolutions per minute, more preferably 5–40 revolutions per minute.

A plating treatment may be carried out while rotating the anode 98 by driving the rotary motor 130 as an anode-rotating device. Alternatively, plating may be carried out while the rotary motor 130 is stopped and the anode 98 is kept stationary. When plating is conducted while rotating the anode 98, a rotating direction of the anode 98 may be the same as, or opposite to, a rotating direction of the substrate W; however, it is preferred to rotate the anode 98 in the same direction as the substrate. A rotational speed of the anode is preferably 3–60 revolutions per minute, more preferably 5–40 revolutions per minute.

The anode 98 may be of any shape insofar as a uniform plated film thickness over an entire substrate surface can be obtained, and can be, for example, an oval or a heart-like shape.

Figure 23:
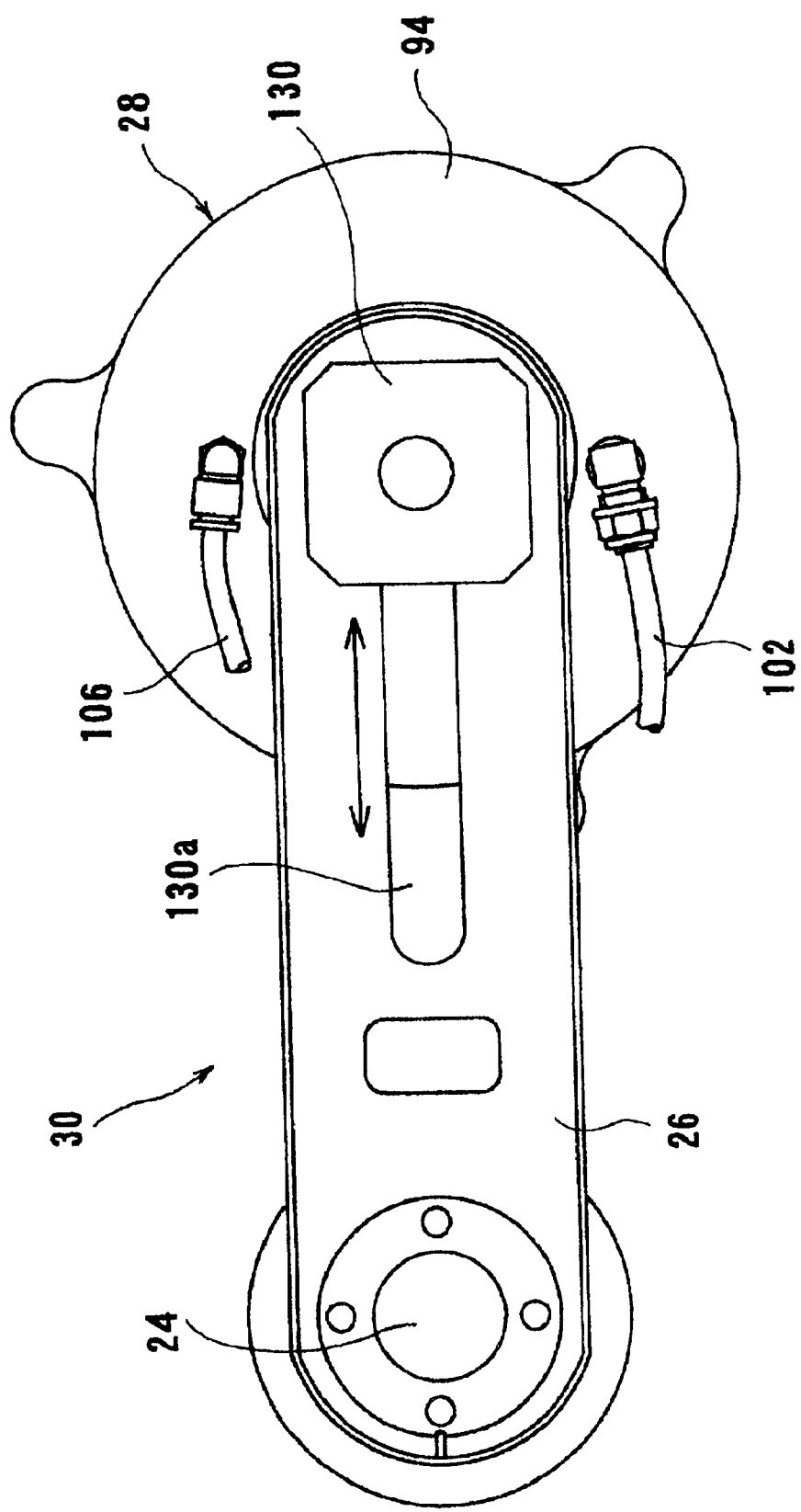
FIG. 23 is a plan view of an electrode arm according to a third embodiment of the present invention.

FIG. 23 is a plan view of electrode arm 30 of a plating apparatus according to a third embodiment of the present invention. Construction of the plating apparatus of this embodiment is fundamentally the same as the above plating apparatus according to the second embodiment. A groove 130a is formed along a length of the electrode arm 30 of this apparatus. Further, rotary motor 130 as an anode-rotating device mounted on an upper end of electrode portion 28 is designed to function also as an anode-translating device. Thus, by actuation of the rotary motor 130, anode 98 can translate in a direction of arrow H shown in FIG. 24. Since other construction is the same as the apparatuses of the above described embodiments, description thereof is herein omitted.

Figure 24:
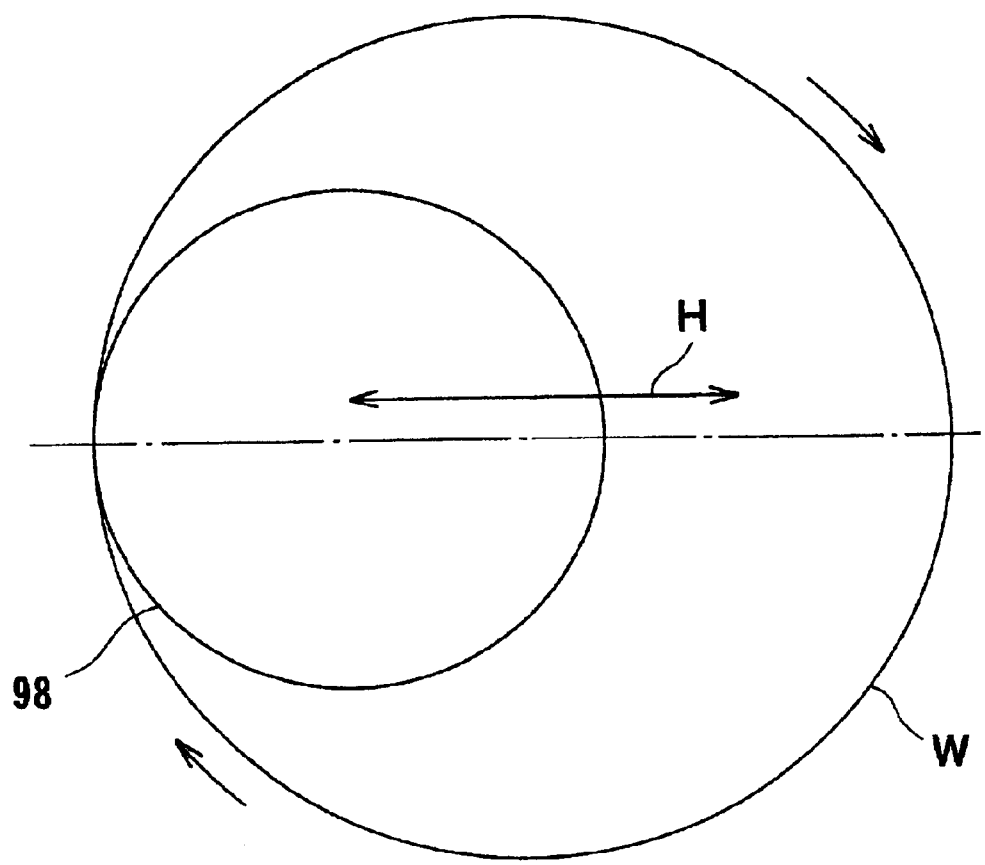
FIG. 24 is a plan view showing a relationship between a substrate and an anode according to the third embodiment of the present invention.

While the plating apparatus of this embodiment operates in the same manner as the plating apparatus of the second embodiment, in the case of this apparatus, simultaneously with rotating of substrate W by rotary motor 64 (see FIG. 4) during a plating process, the anode 98 is translated in the direction of arrow H, shown in FIG. 24, by the rotary motor 130 that functions also as an anode-translating device. Translational speed of the anode 98 is preferably 5–40 reciprocations per minute.

Though the above-described second and third embodiments show a case where a substrate-rotating device allows the substrate to rotate about its central axis, the device may be designed to allow the substrate to revolve eccentrically. It is also possible to design the substrate-rotating device so that the device itself can make a scrolling movement relative to anode 98.

Figure 25:
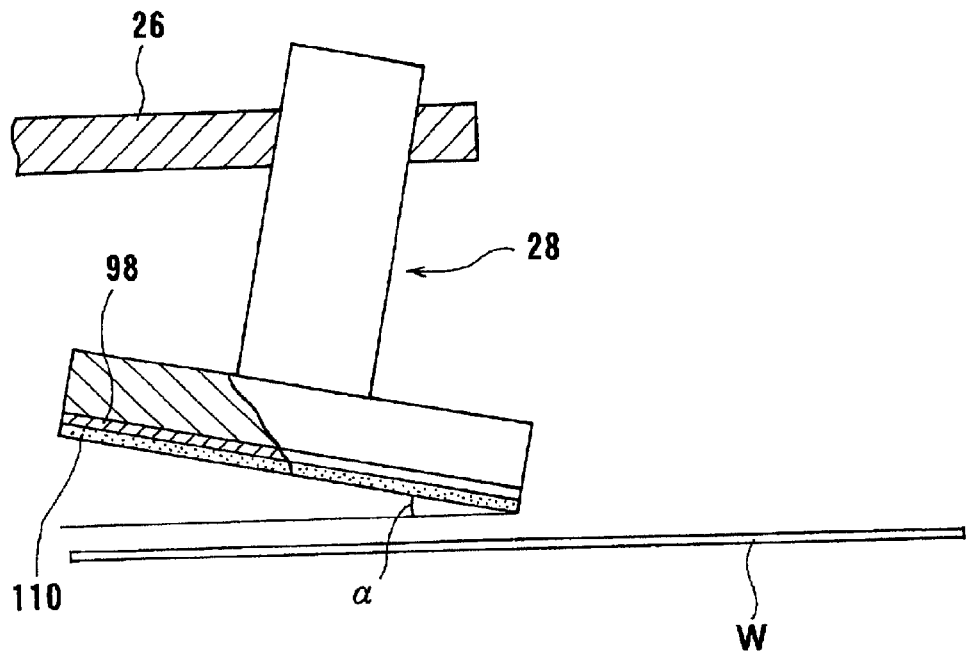
FIG. 25 is a pattern diagram showing a relationship between a substrate and an electrode portion according to a fourth embodiment of the present invention.

FIG. 25 is a pattern diagram illustrating a relationship between substrate W and electrode portion 28 of a plating apparatus according to a fourth embodiment of the present invention.

Though construction of the plating apparatus of this embodiment is fundamentally the same as the above-described apparatuses, it differs in that anode 98 of the electrode portion 28 is inclined relative to substrate W, as shown in FIG. 25. Since other construction of this apparatus is the same as the above-described first embodiment, description thereof is herein omitted.

Figure 30:
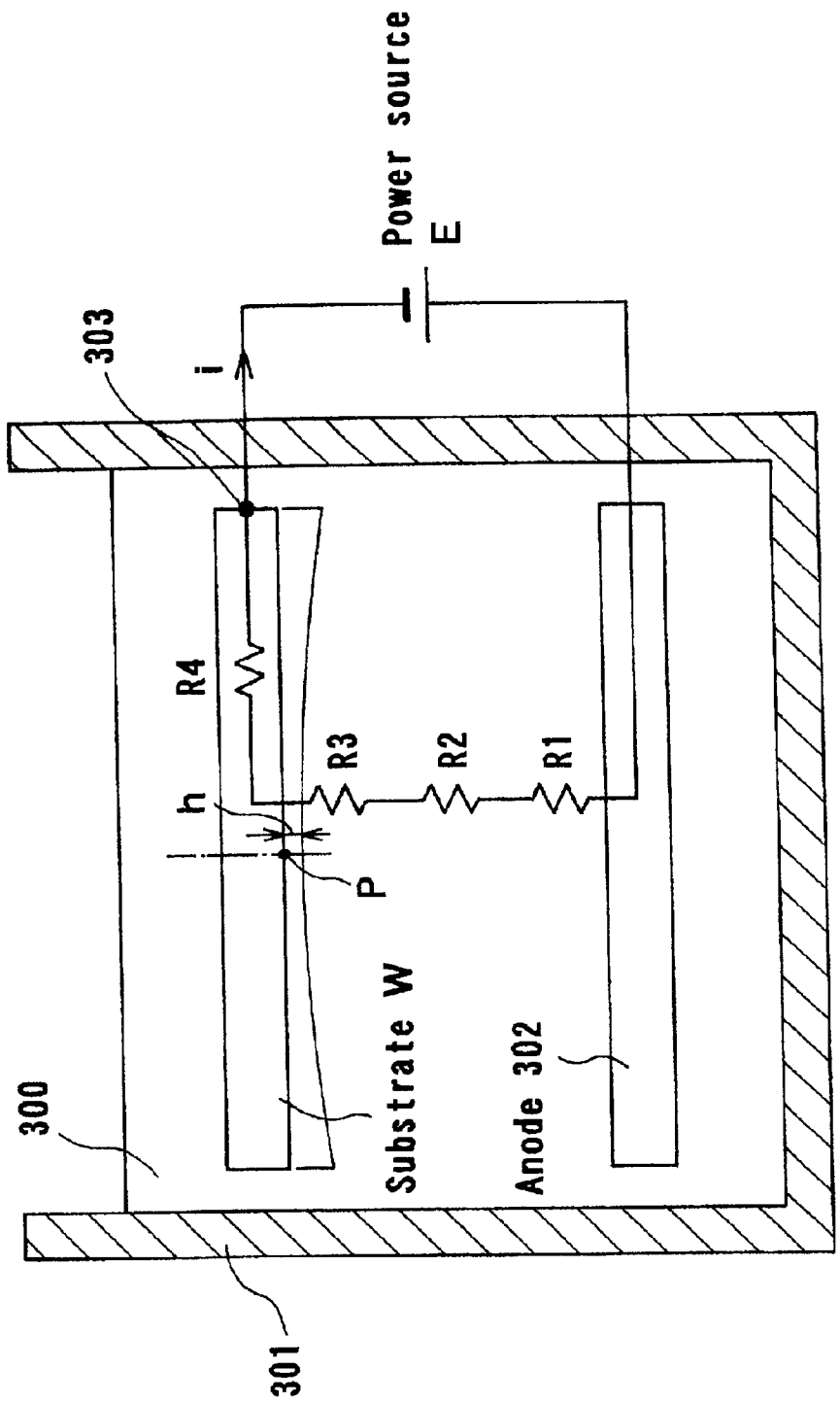
FIG. 30 is a view showing a circuit typically formed by a conventional plating apparatus and its plating treatment

As shown in FIG. 25, the anode 98 is inclined so that a distance between the anode and the substrate W is small on an inner central side of the substrate W and large on an outer peripheral side of the substrate W. An angle of inclination, i.e. angle a shown in FIG. 25, is preferably not more than 30°. By inclining the anode 98 in this manner, resistance R2 of a plating liquid, described above referring to FIG. 30, is made smaller on the inner central side of the substrate and larger on the outer peripheral side of the substrate, whereby an electric current value is made more equal on the inner central side of the substrate to that on the outer peripheral side of the substrate. Thus, in addition to adjustment of the energization time of the plating current according to the second embodiment, electric current values at various points of the substrate can also be adjusted, thereby making a product of the time for passing electric current and the electric current value equal over an entire surface of the substrate, whereby a film thickness of a plated film formed on the substrate W can be made uniform over the entire surface of the substrate W.

Figure 26:
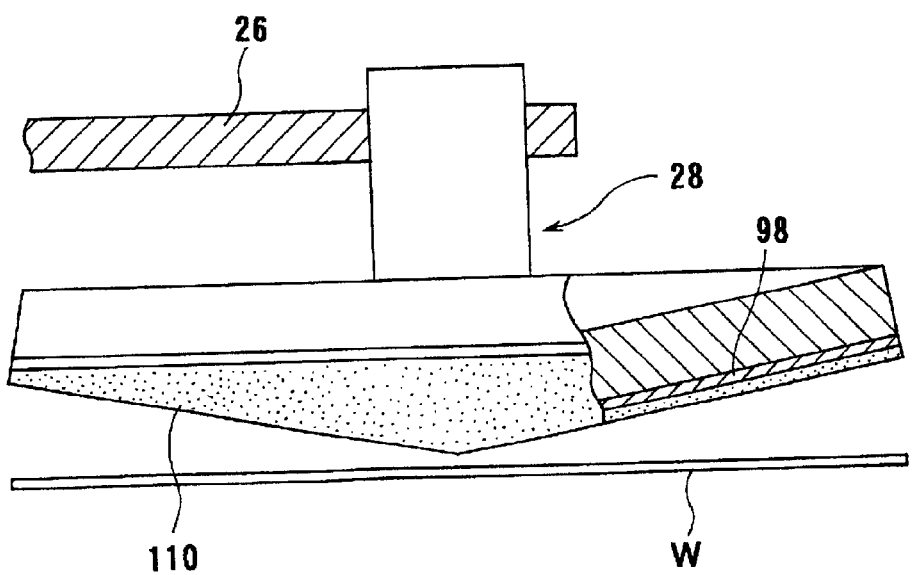
FIG. 26 is a pattern diagram showing a relationship between a substrate and an electrode portion according to a fifth embodiment of the present invention.

Preferably, a minimum distance between the anode 98 and the substrate W, i.e. a distance between the anode and a central portion of the substrate W, is in the range of 2–65 mm. Plating liquid impregnation material 110 should preferably have a thickness of 2–15 mm. It is also possible to make a cross-sectional size of the anode 98 substantially the same as that of the substrate W, and design a combination of the anode 98 and the plating liquid impregnation material 110 as shown in FIG. 26, viz. a symmetrical configuration about a central axis of the substrate. In this case, the above-described adjustment of energization time of the electric current is not necessary, and formation of a plated film having a uniform film thickness can be achieved merely by adjustment of electric current value.

Figure 27A:
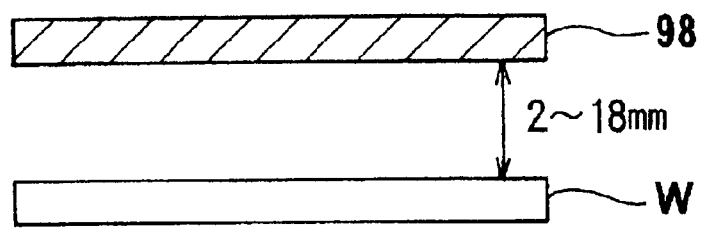
FIG. 27A is a pattern diagram showing a relationship between a substrate and an anode at initiation of plating according to a sixth embodiment of the present invention.
Figure 27B:
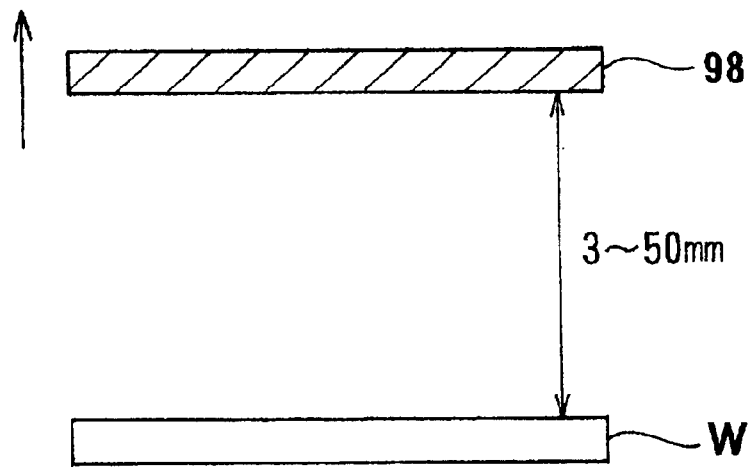
FIG. 27B is a pattern diagram showing a relationship between the substrate and the anode at completion of plating according to the sixth embodiment of the present invention.
Figure 28A:
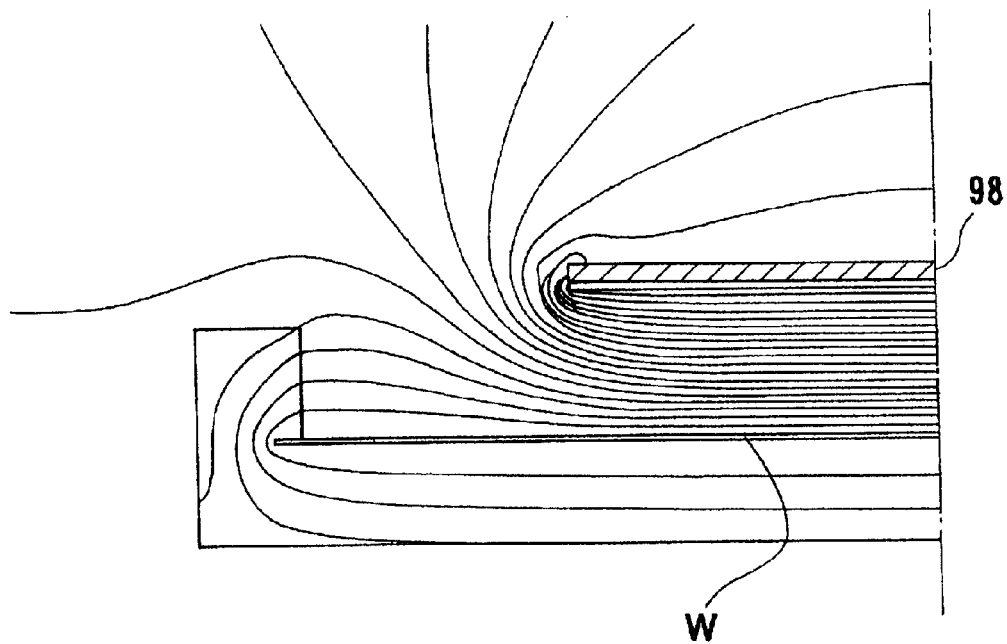
FIG. 28A is an isoelectric line diagram showing a state of an electric field between the anode and the substrate in the relationship of FIG. 27A.
Figure 28B:
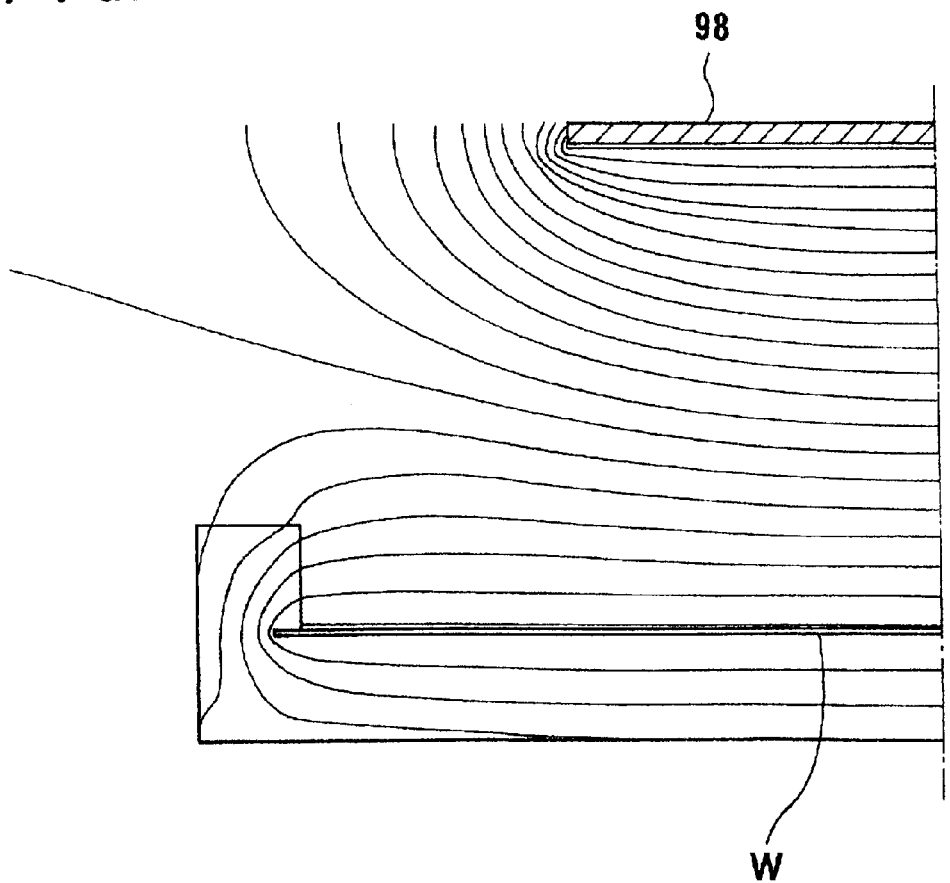
FIG. 28B is an isoelectric line diagram showing a state of an electric field between the anode and the substrate in the relationship of FIG. 27B.

FIG. 27A is a pattern diagram illustrating a relationship between substrate W and anode 98 at initiation of a plating process in a plating apparatus according to a fifth embodiment of the present invention, and FIG. 27B is a pattern diagram illustrating a relationship between substrate W and anode 98 at completion of the plating process in the plating apparatus according to the fifth embodiment of the present invention. FIG. 28A and FIG. 28B are equipotential diagrams showing a state of electric field between the anode 98 and the substrate W in the relationships of FIG. 27A and FIG. 27B, respectively.

Though construction of the plating apparatus of this embodiment is basically the same as the above-described first embodiment, it differs in that motor 54 (see FIGS. 8 and 9) for vertical movement functions as a device for changing a distance between the anode 98 and the substrate W (as a pulling-away device), as shown in FIGS. 27A and 27B.

While the plating apparatus of this embodiment operates in the same manner as the plating apparatus of the first embodiment, in the case of this apparatus, a distance between the anode 98 and the substrate W is changed, during a period between initiation of plating (FIG. 27A) and completion of plating (FIG. 27B), by motor 54 functioning as a pulling-away device. Thus, at the initiation of plating (FIG. 27A), a distance between the anode 98 and the substrate W is set preferably in the range of 2–18 mm. While keeping this distance, a plated film with a thickness of about 100 nm is formed on a surface of the substrate W. Thereafter, plating treatment is continued while a distance between the anode 98 and the substrate W is made larger by pulling the electrode portion 28 upwardly by motor 54. The plating treatment is completed when a desired plated film thickness is obtained (FIG. 27B). A distance between the anode 98 and the substrate W is preferably in the range of 3–50 mm.

Since a distance between the anode 98 and the substrate W is small at initiation of plating, a potential gradient is higher on an inner central side of substrate W than that on an outer peripheral side of the substrate, as shown in FIG. 28A. Accordingly, an electric current value is higher on the inner central side of the substrate W than on the outer peripheral side, whereby a larger amount of plated film is formed on the inner central side of the substrate W. When a plated film is thus formed on the surface of the substrate W, a sheet resistance value at a portion of the substrate where a plated film is formed in a larger amount, i.e., the inner central portion of the substrate W, becomes lower. If plating is continued, a plated film becomes much more thick on the inner central side of the substrate. In view of the above, a distance between the anode 98 and the substrate W is made larger, during a plating process, according to this embodiment.

When a distance between the anode 98 and the substrate W is made larger, as shown in FIG. 28B, a potential gradient on an outer peripheral side of substrate W becomes higher than that on an inner central side of the substrate, whereby an electric current value becomes larger on the outer peripheral side of the substrate W than on the inner central side. Thus, contrary to the case of FIG. 28A, a larger amount of plated film is formed on the outer peripheral side of the substrate W. Therefore, as a result of transition from the state of FIG. 27A to the state of FIG. 27B, in accordance with this embodiment, film thickness of plated film can be finally made uniform over an entire surface of the substrate.

When the electrode portion 28 is pulled upwardly, it may be pulled up slowly, taking a considerable time, or quickly, taking little time.

The embodiments of the present invention as hereinabove described are but illustrative examples, and the present invention is not limited thereto. It will be understood that many changes and modifications may be made to the above embodiments without departing from the spirit of the present invention. It will, therefore, be understood that the above-described embodiments, in combinations thereof, may be practiced within the scope of the present invention.

Though plating apparatuses of a substrate-immersing type, in which plating and treatments incidental thereto can be conducted in a single unit, are described hereinabove, the present invention is not limited to such a type but is applicable to any type of plating apparatuses, including a face-down type and a face-up type. As an example, a plating apparatus of a face-down type, to which a seventh embodiment of the present invention is applied, is shown in FIG. 29.

The plating apparatus shown in FIG. 29 has a substrate holder 200 for detachably holding a substrate W with its surface, to be plated, facing downwardly. A disc-shaped anode 202 (having a smaller cross-sectional size than the substrate W), which is eccentric to the substrate W, is disposed at a bottom of a substantially cylindrical plating tank 201. A rotary motor 203 as an anode-rotating device is provided beneath the anode 202. Further, a rotary motor 205 as a substrate-rotating device is mounted on an upper portion of a frame 204 that supports the substrate holder 200. By thus providing the anode-rotating device 203 and the substrate-rotating device 205, it becomes possible, as with the above-described plating apparatuses of a substrate-immersing type, to make energization time of an electric current on an inner central side of substrate W longer than that on an outer peripheral side of the substrate, whereby a plated film having a uniform film thickness can be formed.

As described hereinabove, according to the present invention, a portion of a substrate facing an anode is moved in such a state that an inner central portion of a surface of the substrate faces the anode for a longer time than does an outer peripheral portion of the surface of the substrate, thereby making energization time of a plating current to the inner central portion of the surface of the substrate longer than energization time of a plating current to the outer peripheral portion of the surface of the substrate, whereby products of the electric current values and the energization times of the electric current at various points of the substrate can be made equal over an entire surface of the substrate. Consequently, it becomes possible to make a film thickness of plated film formed on the substrate uniform over the entire surface of the substrate.

Further, by making a distance between the anode and the inner central portion of the substrate smaller than the distance between the anode and the outer peripheral portion of the substrate, resistance of a plating liquid can be made smaller at the inner central portion of the substrate and larger at the outer peripheral portion of the substrate. This can make the electric current value more equal at the inner central portion of the substrate to that at the outer peripheral portion, whereby a film thickness of a plated film formed on the substrate can be made uniform over an entire surface of the substrate.

Further according to the present invention, a distance between a substrate and the anode can be changed after initiation of plating. Since a potential gradient is higher on an inner central side of a substrate than an outer peripheral side of the substrate at initiation of plating, a larger amount of plated film is formed on the inner central side of the substrate. This situation can be reversed by later making a distance between the anode and the substrate larger, whereby a plated film having a uniform film thickness over an entire surface of the substrate can be obtained.

The above and other objects, features, and advantages of the present invention will be apparent from the following description when taken in conjunction with the accompanying drawings which illustrate preferred embodiments of the present invention by way of example.

What is claimed is:

1. A method for plating a substrate, comprising:

providing a substrate having fine trench patterns which are covered with a seed layer;

disposing said substrate adjacent an anode such that said substrate and said anode face one another and define a plating space therebetween;

supplying a plating liquid into said plating space, said plating liquid containing metal ions and an additive so as to have an initial additive concentration; and forming a plated film on a surface of said seed layer by
(i) applying an electric current between said seed layer and said anode while said plating liquid having said initial additive concentration is in said plating space, and
(ii) while continuing to apply said electric current between said seed layer and said anode, changing the additive concentration of said plating liquid in said plating space relative to said initial additive concentration by supplying a liquid into said plating space.

2. The method according to claim 1, wherein forming a plated film on a surface of said seed layer comprises forming a plated film which extends from a surface of said substrate substantially an equal distance for an entirety of said surface of said substrate.

3. The method according to claim 2, wherein changing the additive concentration of said plating liquid in said plating space relative to said initial additive concentration by supplying a liquid into said plating space comprises changing said additive concentration of said plating liquid in said plating space relative to said initial additive concentration by intermittently supplying said plating liquid into said plating space.

4. The method according to claim 3, wherein changing said additive concentration of said plating liquid in said plating space relative to said initial additive concentration by intermittently supplying said plating liquid into said plating space comprises lowering said additive concentration of said plating liquid in said plating space relative to said initial additive concentration by intermittently supplying said plating liquid into said plating space.

5. The method according to claim 4, wherein lowering said additive concentration of said plating liquid in said plating space relative to said initial additive concentration comprises
(i) lowering said additive concentration of said plating liquid to a first level during a mid stage of the forming of the plated film on said seed layer, and
(ii) lowering said additive concentration of said plating liquid to a second level, which is lower than said first level, during a stage of the forming of the plated film on said seed layer that is subsequent to said mid stage.

6. The method according to claim 5, wherein said additive comprises a brightener.

7. The method according to claim 3, wherein changing said additive concentration of said plating liquid in said plating space relative to said initial additive concentration by intermittently supplying said plating liquid into said plating space comprises raising said additive concentration of said plating liquid in said plating space relative to said initial additive concentration by intermittently supplying said plating liquid into said plating space.

8. The method according to claim 7, wherein
raising said additive concentration of said plating liquid in said plating space relative to said initial additive concentration comprises
   (i) raising said additive concentration of said plating liquid to a first level during a mid stage of the forming of the plated film on said seed layer, and
   (ii) raising said additive concentration of said plating liquid to a second level, which is higher than said first level, during a stage of the forming of the plated film on said seed layer that is subsequent to said mid stage.

9. The method according to claim 8, wherein
said additive comprises a leveler.

10. The method according to claim 2, wherein
changing the additive concentration of said plating liquid in said plating space relative to said initial additive concentration by supplying a liquid into said plating space comprises changing said additive concentration of said plating liquid in said plating space relative to said initial additive concentration by introducing into said plating space a solution or a plating liquid having an additive concentration that is different than said initial additive concentration.

11. The method according to claim 10, wherein
changing said additive concentration of said plating liquid in said plating space relative to said initial additive concentration by introducing into said plating space a solution or a plating liquid having an additive concentration that is different than said initial additive concentration comprises lowering said additive concentration of said plating liquid in said plating space relative to said initial additive concentration by introducing into said plating space a solution or a plating liquid having an additive concentration that is different than said initial additive concentration.

12. The method according to claim 11, wherein
lowering said additive concentration of said plating liquid in said plating space relative to said initial additive concentration comprises
   (i) lowering said additive concentration of said plating liquid to a first level during a mid stage of the forming of the plated film on said seed layer, and
   (ii) lowering said additive concentration of said plating liquid to a second level, which is lower than said first level, during a stage of the forming of the plated film on said seed layer that is subsequent to said mid stage.

13. The method according to claim 12, wherein
said additive comprises a brightener.

14. The method according to claim 10, wherein
changing said additive concentration of said plating liquid in said plating space relative to said initial additive concentration by introducing into said plating space a solution or a plating liquid having an additive concentration that is different than said initial additive concentration comprises raising said additive concentration of said plating liquid in said plating space relative to said initial additive concentration by introducing into said plating space a solution or a plating liquid having an additive concentration that is different than said initial additive concentration.

15. The method according to claim 14, wherein
raising said additive concentration of said plating liquid in said plating space relative to said initial additive concentration comprises
   (i) raising said additive concentration of said plating liquid to a first level during a mid stage of the forming of the plated film on said seed layer, and
   (ii) raising said additive concentration of said plating liquid to a second level, which is higher than said first level, during a stage of the forming of the plated film on said seed layer that is subsequent to said mid stage.

16. The method according to claim 15, wherein
said additive comprises a leveler.

* * * * *